United States Patent
Chung et al.

(10) Patent No.: US 11,606,113 B2
(45) Date of Patent: Mar. 14, 2023

(54) TRANSCEIVER PERFORMING INTERNAL LOOPBACK TEST AND OPERATION METHOD THEREOF

(71) Applicant: SAMSUNG ELECTRONICS CO., LTD., Suwon-si (KR)

(72) Inventors: Younwoong Chung, Seongnam-si (KR); Yungeun Nam, Anyang-si (KR); Jongshin Shin, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/384,991

(22) Filed: Jul. 26, 2021

(65) Prior Publication Data

US 2022/0190869 A1 Jun. 16, 2022

(30) Foreign Application Priority Data

Dec. 11, 2020 (KR) .......................... 10-2020-0173398

(51) Int. Cl.
*H04B 1/40* (2015.01)
*H04B 17/19* (2015.01)
*H03K 19/00* (2006.01)

(52) U.S. Cl.
CPC ........... *H04B 1/40* (2013.01); *H03K 19/0005* (2013.01); *H04B 17/19* (2015.01)

(58) Field of Classification Search
CPC ...... H04B 1/40; H04B 17/0085; H04B 17/19; H04B 17/14; H03K 19/0005; H04L 1/244; H04L 1/24; G01R 31/3167
See application file for complete search history.

(56) References Cited

U.S. PATENT DOCUMENTS

| | | | |
|---|---|---|---|
| 6,968,490 B2 | 11/2005 | Tarango et al. | |
| 7,315,182 B2 | 1/2008 | Payne et al. | |
| 7,756,197 B1 | 7/2010 | Ferguson et al. | |
| 7,809,275 B2 | 10/2010 | Aronson et al. | |
| 8,169,225 B2 | 5/2012 | Schuttert | |
| 8,598,898 B2 | 12/2013 | Sul et al. | |
| 8,606,193 B2 | 12/2013 | Ko et al. | |
| 10,014,899 B2 | 7/2018 | Payne et al. | |
| 10,163,525 B2 * | 12/2018 | Yun | G01R 31/2851 |
| 10,567,124 B2 | 2/2020 | Kim et al. | |
| 10,649,031 B2 * | 5/2020 | Ekman | G01R 31/318385 |
| 11,181,579 B2 * | 11/2021 | Tokuz | G01R 31/318572 |
| 2010/0313089 A1 * | 12/2010 | Rajski | G01R 31/318547 714/E11.155 |
| 2018/0359060 A1 * | 12/2018 | Kim | H04L 1/244 |
| 2019/0327036 A1 | 10/2019 | Gloekner et al. | |
| 2020/0151076 A1 | 5/2020 | LaCroix | |

* cited by examiner

*Primary Examiner* — Khanh C Tran
(74) *Attorney, Agent, or Firm* — Lee IP Law, P.C.

(57) ABSTRACT

Disclosed is a transceiver which includes a logic circuit that generates parallel transmission data in response to a first test mode signal or a second test mode signal, a serializer that converts the parallel transmission data into serial transmission data, a driver that outputs the serial transmission data through transmission pads, an analog circuit that receives serial reception data through reception pads, a deserializer that converts the serial reception data into parallel reception data, a plurality of test switches switched in response to the first test mode signal, and a test circuit that is electrically connected to the analog circuit through the plurality of test switches and outputs serial post data corresponding to the serial transmission data to the analog circuit.

19 Claims, 18 Drawing Sheets

TRANSCEIVER PERFORMING INTERNAL LOOPBACK TEST AND OPERATION METHOD THEREOF

CROSS-REFERENCE TO RELATED APPLICATIONS

Korean Patent Application No. 10-2020-0173398, filed on Dec. 11, 2020, in the Korean Intellectual Property Office, and entitled: "Transceiver Performing Internal Loopback Test and Operation Method Thereof," is incorporated by reference herein in its entirety.

BACKGROUND

1. Field

Embodiments relate to a device for testing a serial communication interface circuit, and more particularly, relate to a transceiver performing an internal loopback test and an operation method thereof.

2. Description of the Related Art

An electronic device may exchange data with another electronic device by transmitting and receiving electrical signals through a channel (e.g., a signal line). The electronic devices may include an interface circuit for serial communication.

SUMMARY

Embodiments are directed to a transceiver, including: a logic circuit configured to generate parallel transmission data in response to a first test mode signal or a second test mode signal; a serializer configured to convert the parallel transmission data into serial transmission data; a driver configured to output the serial transmission data through transmission pads; an analog circuit configured to receive serial reception data through reception pads; a deserializer configured to convert the serial reception data into parallel reception data; a plurality of test switches configured to be switched in response to the first test mode signal; and a test circuit electrically connected to the analog circuit through the plurality of test switches, and configured to output serial post data corresponding to the serial transmission data to the analog circuit.

Embodiments are directed to an interface circuit implemented on one chip, the interface circuit including: transmission pads configured to output serial transmission data to an outside of the one chip; reception pads configured to receive serial reception data from the outside of the one chip; and a transceiver configured to: generate the serial transmission data or to process the serial reception data in a normal mode, and form a loop in an interior of the transceiver, and to generate test result data based on the serial transmission data in a test mode. The transceiver may include: a logic circuit configured to generate parallel transmission data; a serializer configured to convert the parallel transmission data into the serial transmission data; a driver configured to output the serial transmission data through the transmission pads; an analog circuit configured to receive the serial reception data through the reception pads; a deserializer configured to convert the serial reception data into parallel reception data; and a test circuit electrically connected to the analog circuit in the test mode, and configured to output serial post data corresponding to the serial transmission data to the analog circuit.

Embodiments are directed to an operation method of a transceiver that includes an analog circuit and a test circuit, the method including: generating parallel transmission data in response to a test mode signal; converting the parallel transmission data into serial transmission data; generating serial post data corresponding to the serial transmission data; converting the serial post data into parallel post data; and comparing the parallel post data and the parallel transmission data to generate test result data. The test circuit may include: a resistor ladder including a plurality of variable resistors connected in series between a first voltage node and a second voltage node; and a first multiplexer and a second multiplexer connected to different nodes between the plurality of variable resistors.

BRIEF DESCRIPTION OF THE FIGURES

Features will become apparent to those of skill in the art by describing in detail example embodiments with reference to the attached drawings in which.

DETAILED DESCRIPTION

Figure 1:
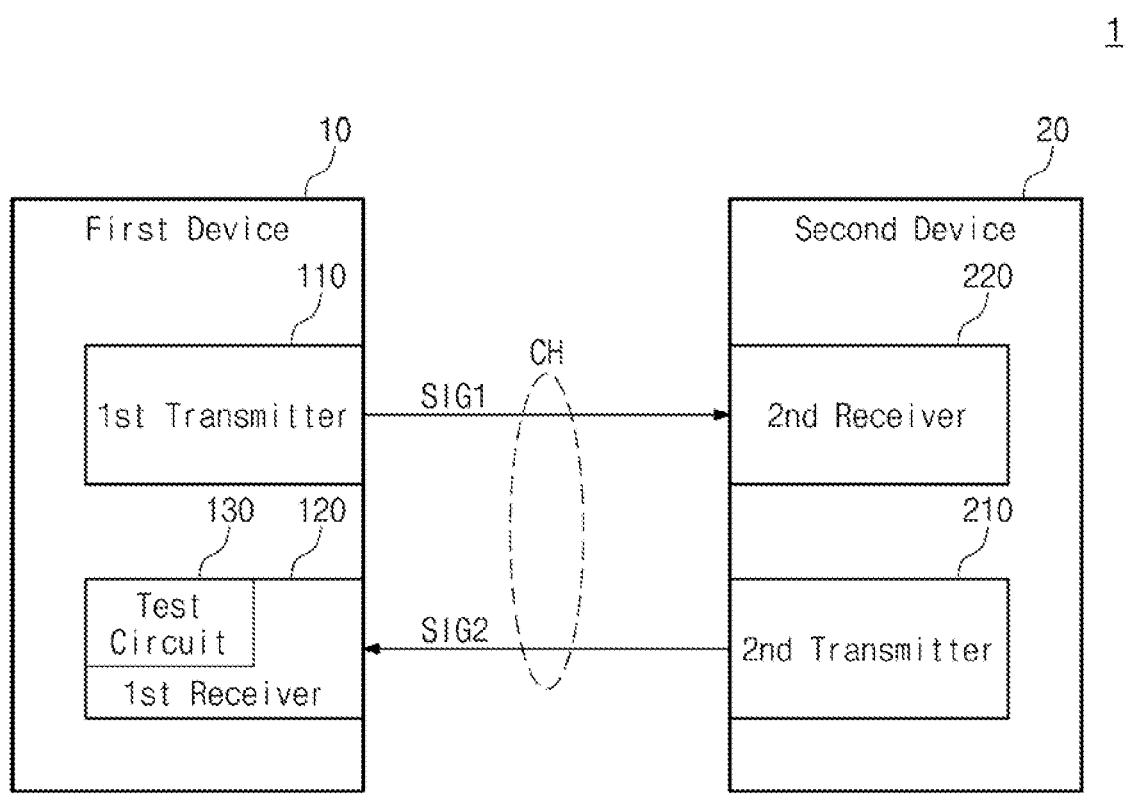
FIG. 1 is a block diagram illustrating a transmission and reception system according to an example embodiment.

FIG. 1 is a block diagram illustrating a transmission and reception system according to an example embodiment.

Referring to FIG. 1, a transmission and reception system 1 may include a first device 10 and a second device 20.

According to an example embodiment, each of the first device 10 and the second device 20 may be implemented in the form of a portable communication terminal, a personal digital assistant (PDA), a portable multimedia player (PMP), a smartphone, or a wearable device, or in the form of a computing device such as a personal computer, a server, a workstation, or a notebook computer. Each of the first device 10 and the second device 20 may be a hardware component included in one user device, for example, a processor, a memory device, a storage device, or a control device.

The first device 10 and the second device 20 may exchange signals SIG1 and SIG2 through a communication channel CH. Each of the first device 10 and second device 20 may include a transmitter and a receiver for the purpose of transmitting and receiving the signals SIG1 and SIG2. For example, the first device 10 may include a first transmitter 110 and a first receiver 120, and the second device 20 may include a second transmitter 210 and a second receiver 220.

The first transmitter 110 may transmit information generated at the first device 10 to the second device 20 through the channel CH as the first signal SIG1. The second receiver 220 may receive the first signal SIG1 from the first transmitter 110 through the channel CH. The second transmitter 210 may transmit information generated at the second device 20 to the first device 10 through the channel CH as the second signal SIG2. The first receiver 120 may receive the second signal SIG2 from the second transmitter 210 through the channel CH.

According to an example embodiment, the channel CH may be a signal line (i.e., a wired communication channel) electrically connecting the first device 10 and the second device 20, or may be a wireless communication channel. Thus, each of the transmitters 110 and 210 and the receivers 120 and 220 may transmit/receive various types of signals such as an electrical signal, an optical signal, and a wireless signal. Below, for convenience of description, it is assumed that each of the transmitters 110 and 210 and the receivers 120 and 220 operates based on an electrical signal.

According to an example embodiment, the first transmitter 110 and the first receiver 120 are illustrated as independent of each other at the first device 10, and the second transmitter 210 and the second receiver 220 are illustrated as independent of each other at the second device 20. However, each of the first device 10 and the second device 20 may be implemented to include one transceiver (or transmitter/receiver) circuit.

According to an example embodiment, information that the second transmitter 210 transmits may be different from information that the first receiver 120 receives. As such, an error or an abnormal operation may be caused at the first device 10, e.g., because a signal may be distorted due to a noise while the second signal SIG2 passes through the channel CH or a defect may occur at the first receiver 120 itself.

According to an example embodiment, the first receiver 120 may include a test circuit 130 to detect such a self-defect which is a defect of the first receiver 120 itself. The test circuit 130 may perform an internal loopback test to detect a defect of the first receiver 120 itself. The defect of the first receiver 120 itself may include that a function is not normally performed, e.g., due to a failure of a deserializer or an analog front end included in the first receiver 120.

Configurations and operations of the first transmitter 110, the first receiver 120, and the test circuit 130 described above will now be described in more detail.

Figure 2A:
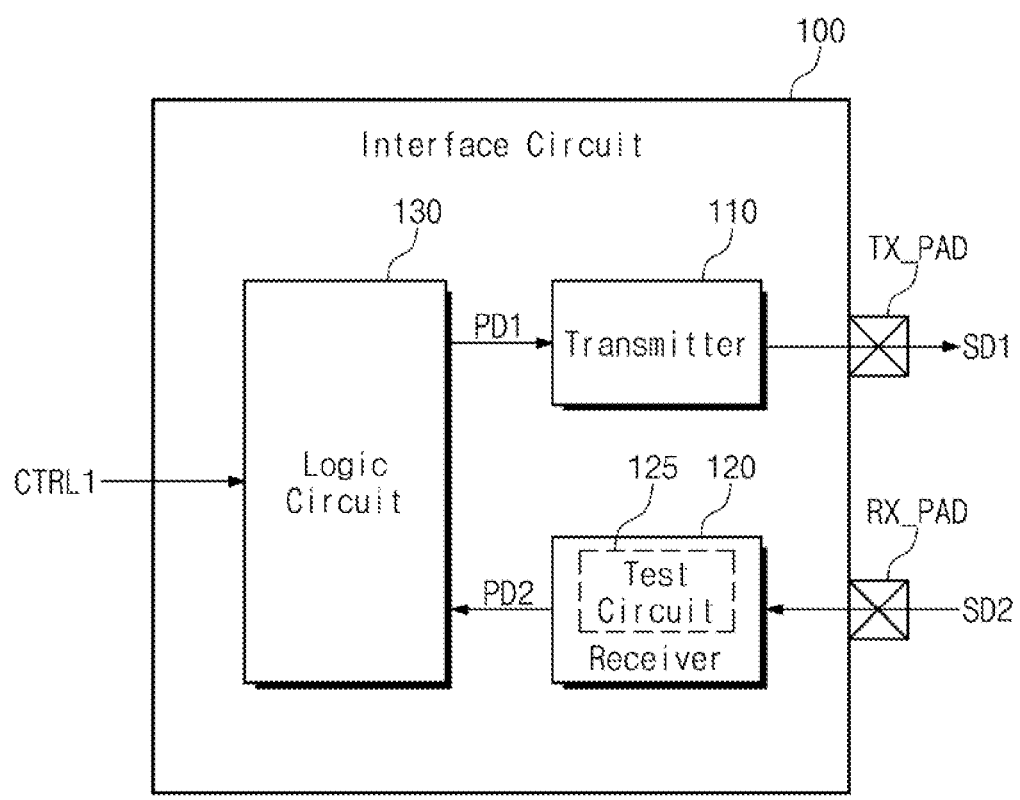
FIGS. 2A to 2C are block diagrams illustrating an interface circuit according to an example embodiment.
Figure 2B:
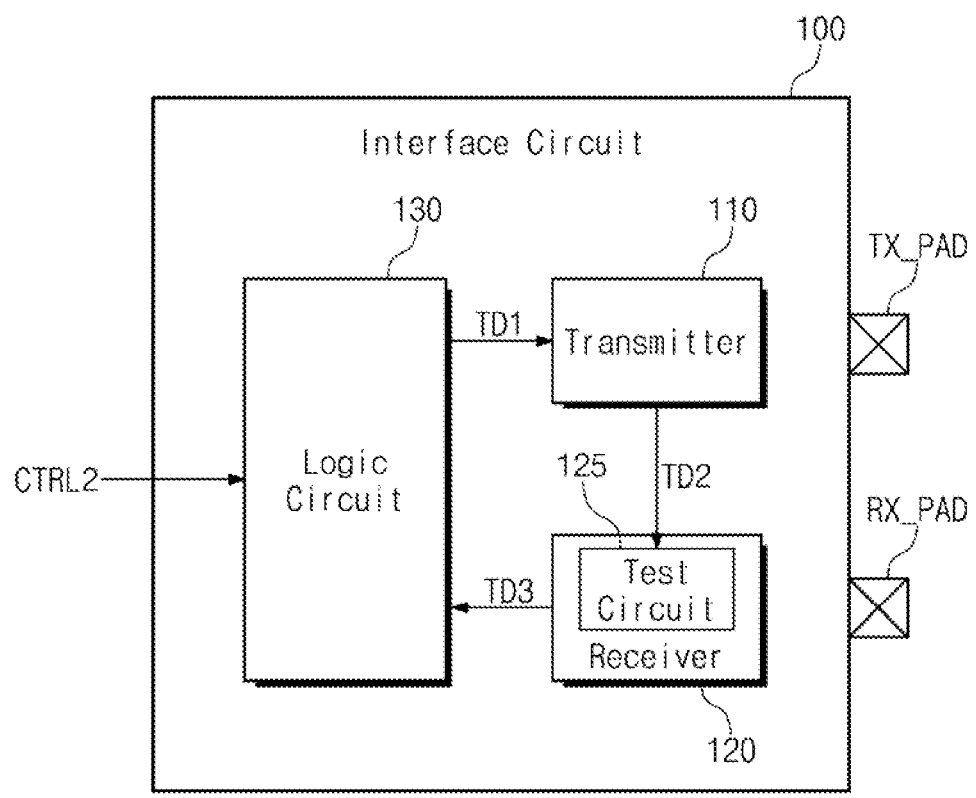
Figure 2C:
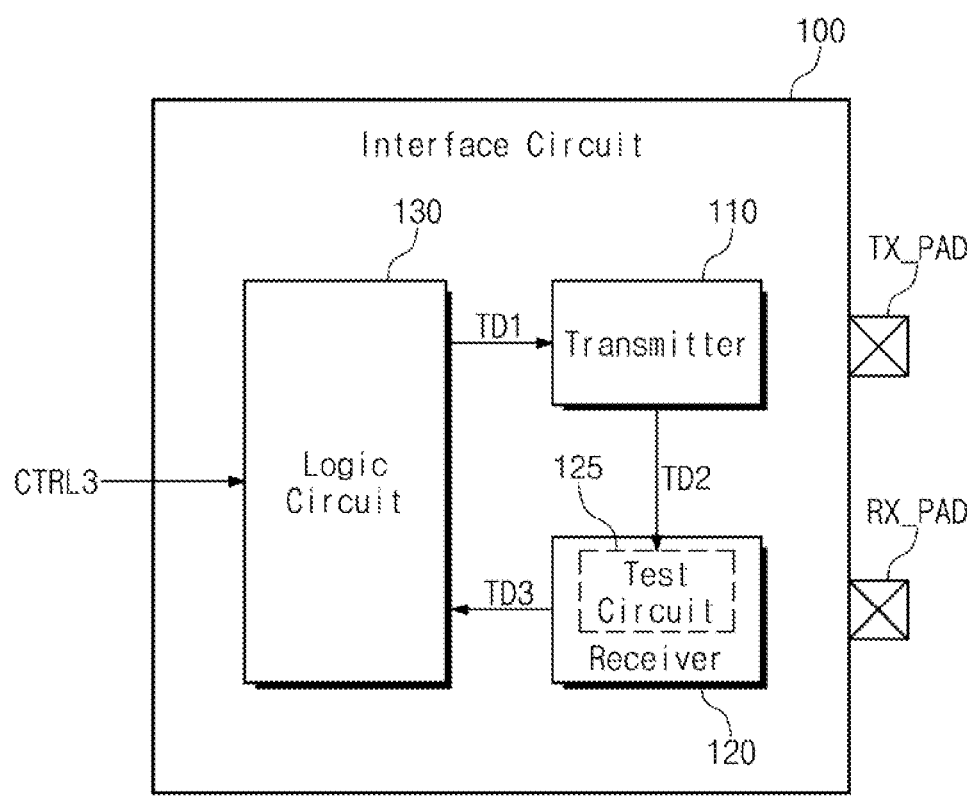

FIGS. 2A to 2C are block diagrams illustrating an interface circuit according to an example embodiment.

Referring to FIGS. 2A to 2C, an interface circuit 100 may include a transmitter 110, a receiver 120, and a logic circuit 130. The interface circuit 100 may be referred to as a transceiver. The receiver 120 may include a test circuit 125. The transmitter 110, the receiver 120, and the test circuit 125 may correspond to the first transmitter 110, the first receiver 120, and the test circuit 130 of FIG. 1, respectively.

The interface circuit 100 may be electrically connected with a transmission pad TX_PAD and a reception pad RX_PAD. The interface circuit 100 may be implemented with one chip, and the transmission pad TX_PAD and the reception pad RX_PAD may be located outside the chip to provide a data input/output path.

The interface circuit 100 may operate in a normal mode or a test mode. FIG. 2A is a diagram illustrating a data flow of the interface circuit 100 in the normal mode. FIG. 2B is a diagram illustrating a data flow of the interface circuit 100 in a first test mode. FIG. 2C is a diagram illustrating a data flow of the interface circuit 100 in a second test mode.

Referring to FIG. 2A, in the normal mode, the interface circuit 100 may exchange data with an external device. According to an example embodiment, the logic circuit 130 may generate first parallel data PD1 in response to a transmission/reception control signal CTRL1 of a controller (not illustrated). The first parallel data PD1 may include information that the logic circuit 130 intends to transfer to the external device. The logic circuit 130 may provide the first parallel data PD1 to the transmitter 110.

The transmitter 110 may convert the first parallel data PD1 into first serial data SD1. The transmitter 110 may transmit the first serial data SD1 to the external device through the transmission pad TX_PAD. The first serial data SD1 may correspond to the first signal SIG1 of FIG. 1.

The receiver 120 may receive second serial data SD2 from the external device through the reception pad RX_PAD. The second serial data SD2 may correspond to the second signal SIG2 of FIG. 1. The receiver 120 may convert the second serial data SD2 into second parallel data PD2, and may provide the second parallel data PD2 to the logic circuit 130. In this case, the test circuit 125 may be in a disable state. Thus, in the receiver 120, the second serial data SD2 may be converted into the second parallel data PD2 without passing through the test circuit 125.

The logic circuit 130 may receive the second parallel data PD2 in response to the transmission/reception control signal CTRL1 of the controller (not illustrated). The second parallel data PD2 may include information that the external device intends to transfer to the logic circuit 130. To process the second parallel data PD2, the logic circuit 130 may include at least one of a central processing unit (CPU), an image signal processing unit (ISP), a digital signal processing unit (DSP), a graphics processing unit (GPU), a vision processing unit (VPU), and a neural processing unit (NPU).

Referring to FIG. 2B, in the first test mode, the interface circuit 100 may perform an internal loopback test. In the first test mode, the interface circuit 100 may form an internal loop passing through all the components of the receiver 120 to perform the internal loopback test. The internal loopback test performed in the first test mode may be referred to as a "full-path test".

According to an example embodiment, the logic circuit 130 may generate first test data TD1 in response to a test control signal CTRL2 of the controller (not illustrated). The first test data TD1 may be in the form of parallel data. The logic circuit 130 may provide the first test data TD1 to the transmitter 110.

The transmitter 110 may convert the first test data TD1 into second test data TD2. The second test data TD2 may be in the form of serial data. The transmitter 110 may provide the second test data TD2 to the receiver 120. In this case, the second test data TD2 may not pass through the transmission pad TX_PAD.

The test circuit 125 may directly receive the second test data TD2 from the transmitter 110. The test circuit 125 may generate serial data corresponding to the second test data TD2. The test circuit 125 may include a resistor ladder and a multiplexer. A configuration of the test circuit 125 will be described in more detail with reference to FIG. 4A.

The receiver 120 may convert the serial data generated at the test circuit 125 into third test data TD3. The third test data TD3 may be in the form of parallel data. The receiver 120 may provide the third test data TD3 to the logic circuit 130.

The logic circuit 130 may compare the first test data TD1 and the third test data TD3 to generate a test result signal. When a difference value of the first test data TD1 and the third test data TD3 exceeds a reference error range, the logic circuit 130 may generate the test result signal including information that a defect occurs within the interface circuit 100.

The defect in the interface circuit 100 may mean a defect of the receiver 120. Defects of the transmitter 110 and the logic circuit 130 may be detected through other methods. For example, whether the transmitter 110 and the logic circuit 130 operate normally may be determined by probing the transmission pad TX_PAD when the first test data TD1 generated at the logic circuit 130 are output through the transmitter 110.

According to an example embodiment, the test circuit 125 may be used to detect a defect of the receiver 120 under assumption that the transmitter 110 and the logic circuit 130 operate normally.

Referring to FIG. 2C, in the second test mode, the interface circuit 100 may perform the internal loopback test. In the second test mode, the interface circuit 100 may form an internal loop passing through a part of the components of the receiver 120 to perform the internal loopback test. The internal loopback test performed in the second test mode may be referred to as a "part-path test".

According to an example embodiment, the logic circuit 130 may generate the first test data TD1 in response to a test control signal CTRL3 of the controller (not illustrated). The transmitter 110 may convert the first test data TD1 into the second test data TD2 and may provide the second test data TD2 to the receiver 120.

The receiver 120 may directly receive the second test data TD2 from the transmitter 110 and may convert the second test data TD2 into the third test data TD3. In this case, the test circuit 125 may be in a disable state. Thus, in the receiver 120, the second test data TD2 may be converted into the third test data TD3 without passing through the test circuit 125.

A data flow in the second test mode is similar to the data flow in the first test mode described with reference to FIG. 2B except that data do not pass through the test circuit 125, and thus, additional description will be omitted to avoid redundancy.

Figure 3A:
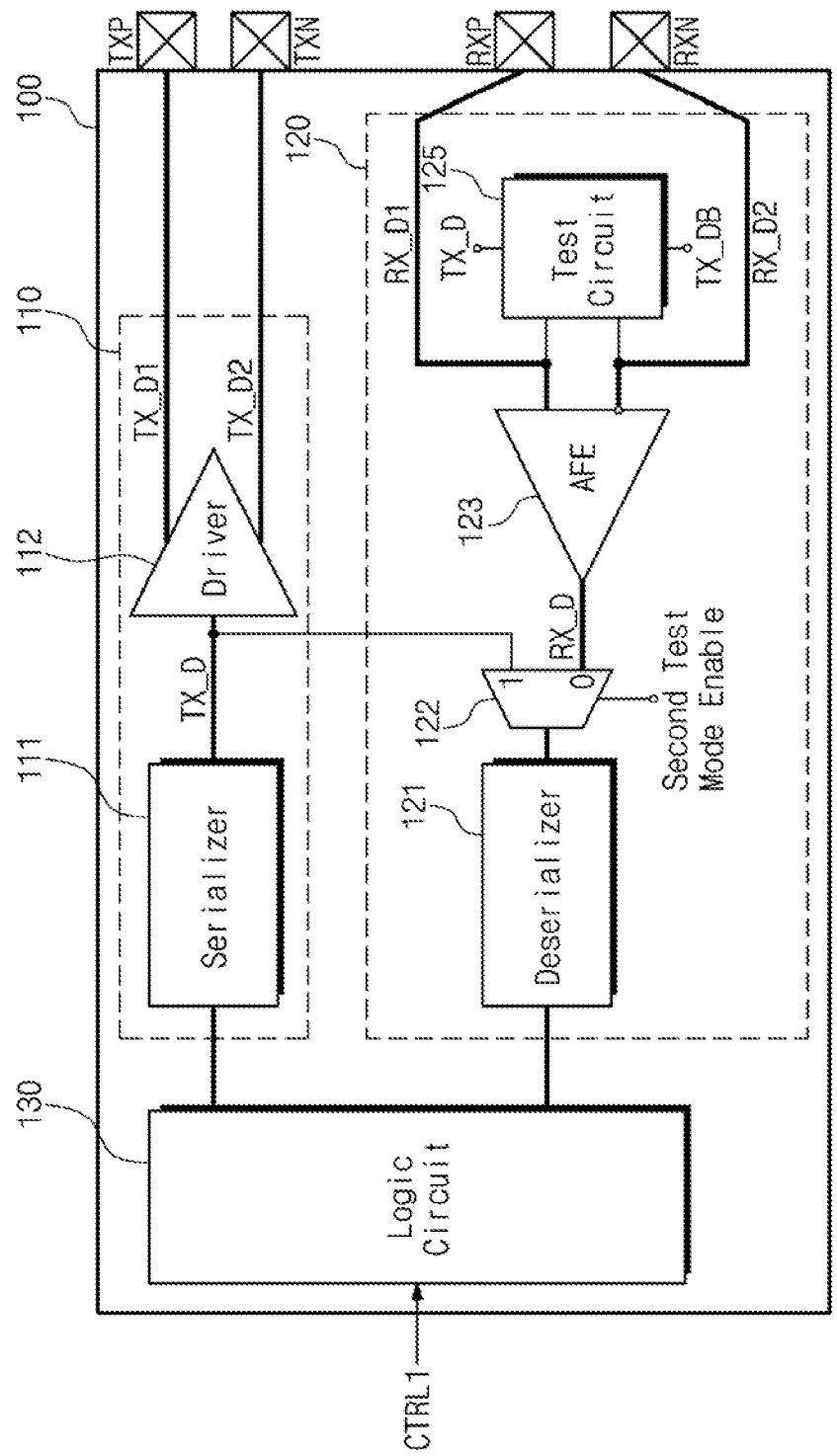
FIGS. 3A to 3C are block diagrams illustrating an example embodiment of an interface circuit of FIGS. 2A to 2C.
Figure 3B:
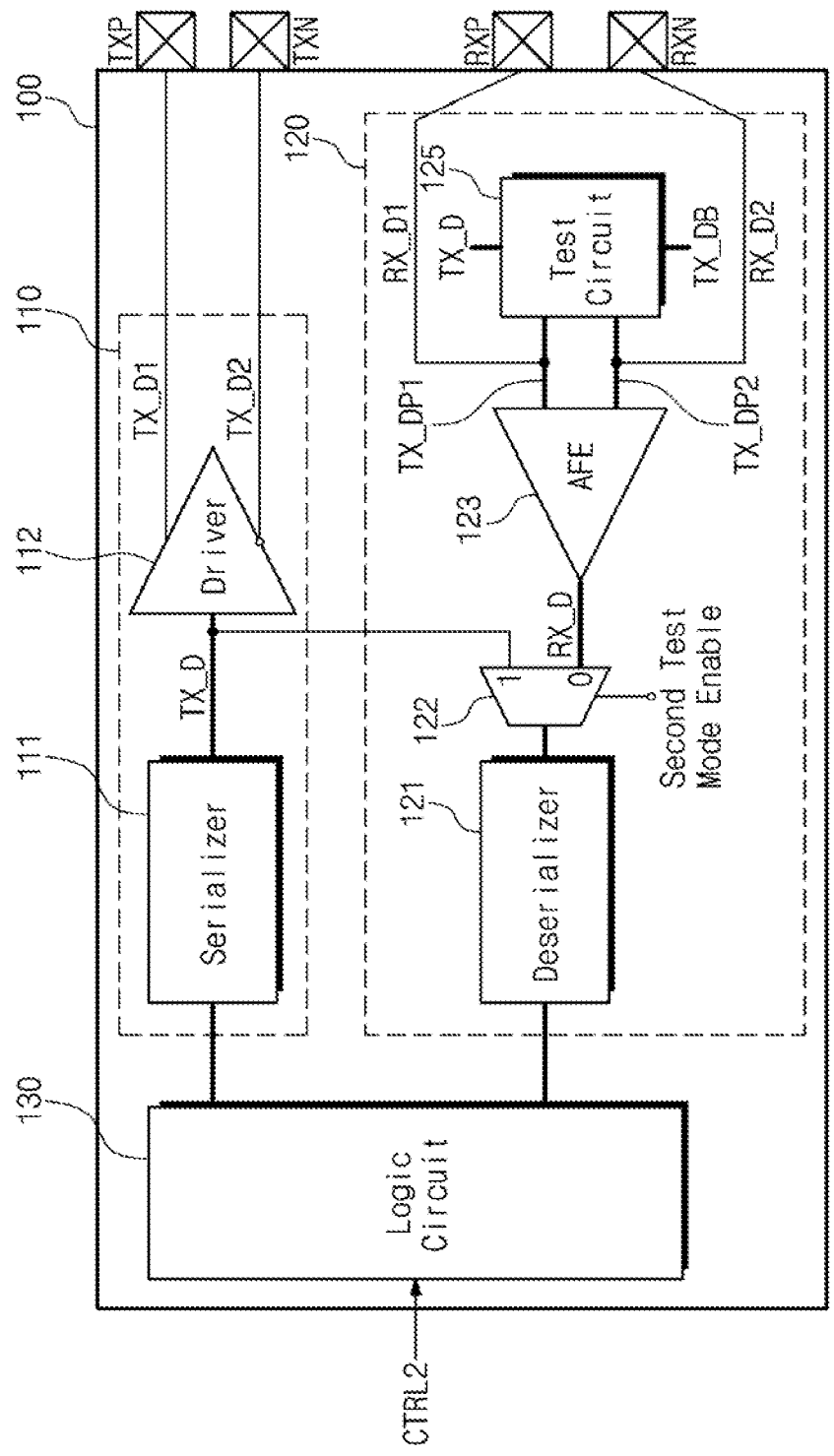
Figure 3C:
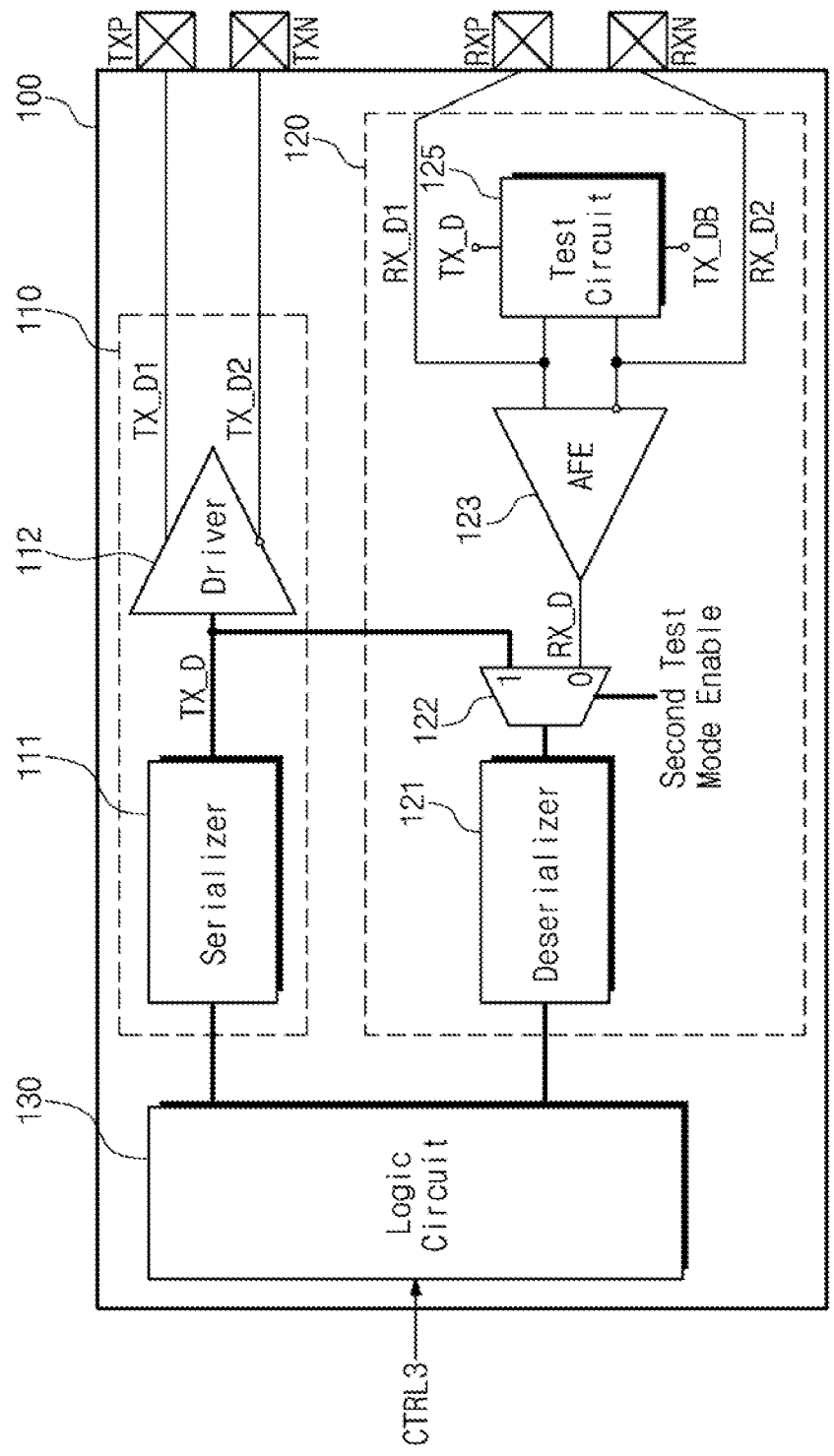

FIGS. 3A to 3C are block diagrams illustrating an example embodiment of an interface circuit of FIGS. 2A to 2C.

Referring to FIGS. 2A to 2C and 3A to 3C, the interface circuit 100 may include the transmitter 110, the receiver 120, and the logic circuit 130. According to an example embodiment, the interface circuit 100 may be electrically connected with differential transmission pads TXP and TXN and differential reception pads RXP and RXN. The transmitter 110 may output differential signals to the differential transmission pads TXP and TXN, and the receiver 120 may receive differential signals from the differential reception pads RXP and RXN.

In further detail, referring to FIGS. 2A and 3A, the transmitter 110 may include a serializer 111 and a driver 112.

In the normal mode, the serializer 111 may receive data of a parallel format from the logic circuit 130 and may convert the data of the parallel format into transmission data TX_D of a serial format. The transmission data TX_D may include the first serial data SD1 of FIG. 2A. The serializer 111 may provide the transmission data TX_D to the driver 112. The driver 112 may convert the transmission data TX_D into differential signals, that is, first transmission data TX_D1 and second transmission data TX_D2, and may output the first transmission data TX_D1 and the second transmission data TX_D2 through the differential transmission pads TXP and TXN.

The receiver 120 may include a deserializer 121, a multiplexer 122, an analog front end 123, and the test circuit 125.

In the normal mode, the test circuit 125 may be in a disable state. The analog front end 123 may receive differential signals, that is, first reception data RX_D1 and second reception data RX_D2, through the differential reception pads RXP and RXN. The analog front end 123 may perform amplification and waveform shaping on the first reception data RX_D1 and the second reception data RX_D2 to generate reception data RX_D. The reception data RX_D may include the second serial data SD2 of FIG. 2A.

The multiplexer 122 may receive the transmission data TX_D and the reception data RX_D, and may output the reception data RX_D in the normal mode. The deserializer 121 may convert the reception data RX_D output from the multiplexer 122 into data of a parallel format, and may provide the data of the parallel format to the logic circuit 130. The logic circuit 130 may process the data of the parallel format to extract information that the external device intends to transfer.

FIGS. 3B and 3C may be similar to FIG. 3A in configuration but may be different from FIG. 3A in a data flow.

Referring to FIGS. 2B and 3B, in the first test mode, the serializer 111 may receive data of a parallel format from the logic circuit 130 and may convert the data of the parallel format into the transmission data TX_D of a serial format. The transmission data TX_D may include the second test data TD2 of FIG. 2B. The serializer 111 may provide the transmission data TX_D to the test circuit 125.

In the first test mode, the test circuit 125 may receive transmission data TX_D and inversion data TX_DB, which is an inverted version of the transmission data TX_D, from the serializer 111. Thus, the test circuit 125 may receive the transmission data TX_D and the inversion data TX_DB in a differential signal form.

The test circuit 125 may generate first post data TX_DP1 and second post data TX_DP2 based on the transmission data TX_D and the inversion data TX_DB. The first post data TX_DP1 may correspond to the first reception data RX_D1 in the normal mode. The second post data TX_DP2 may correspond to the second reception data RX_D2 in the normal mode. The test circuit 125 may provide the first post data TX_DP1 and the second post data TX_DP2 to the analog front end 123.

The analog front end 123 may generate the reception data RX_D based on the first post data TX_DP1 and the second post data TX_DP2, and may provide the reception data RX_D to the multiplexer 122. The multiplexer 122 may output the reception data RX_D to the deserializer 121 in the first test mode. The deserializer 121 may convert the reception data RX_D into data of a parallel format, and may provide the data of the parallel format to the logic circuit 130.

Referring to FIGS. 2C and 3C, in the second test mode, the serializer 111 may receive data of a parallel format from the logic circuit 130, and may convert the data of the parallel format into the transmission data TX_D of a serial format. The transmission data TX_D may include the second test data TD2 of FIG. 2C. The serializer 111 may provide the transmission data TX_D to the receiver 120.

In the second test mode, the test circuit 125 and the analog front end 123 may be in a disable state. The multiplexer 122 may select the transmission data TX_D from the serializer 111 so as to be output to the deserializer 121. In an example embodiment, the multiplexer 122 may receive a second test mode enable signal from the logic circuit 130, and the multiplexer 122 may output the transmission data TX_D in response to the second test mode enable signal. The deserializer 121 may convert the transmission data TX_D into data of a parallel format, and may provide the data of the parallel format to the logic circuit 130.

Figure 4A:
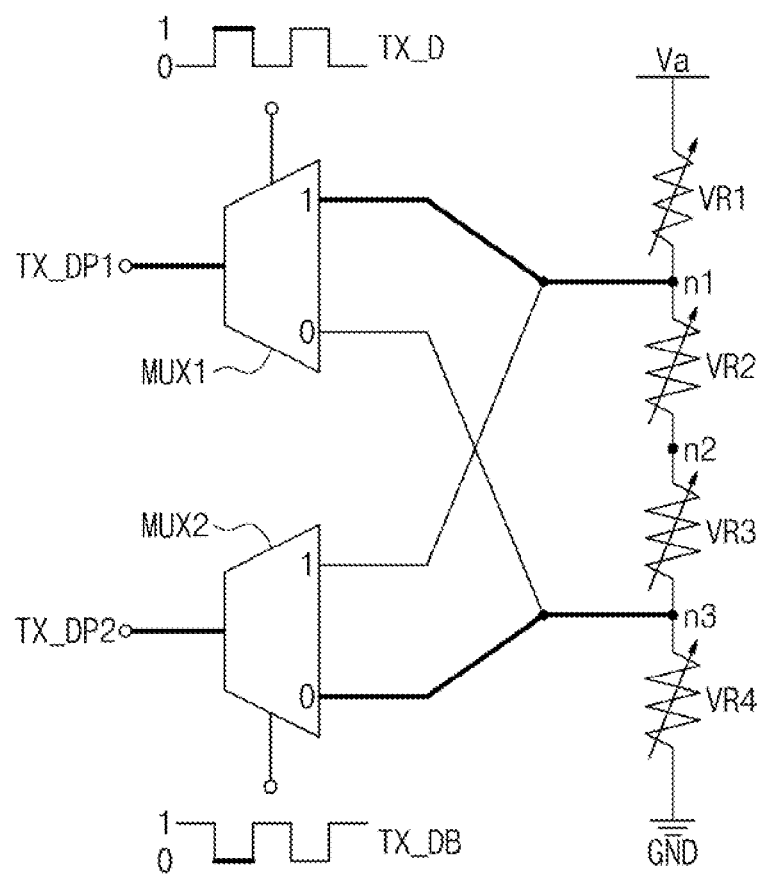
FIGS. 4A and 4B are diagrams illustrating operations of a test circuit of FIG. 3B.
Figure 4B:
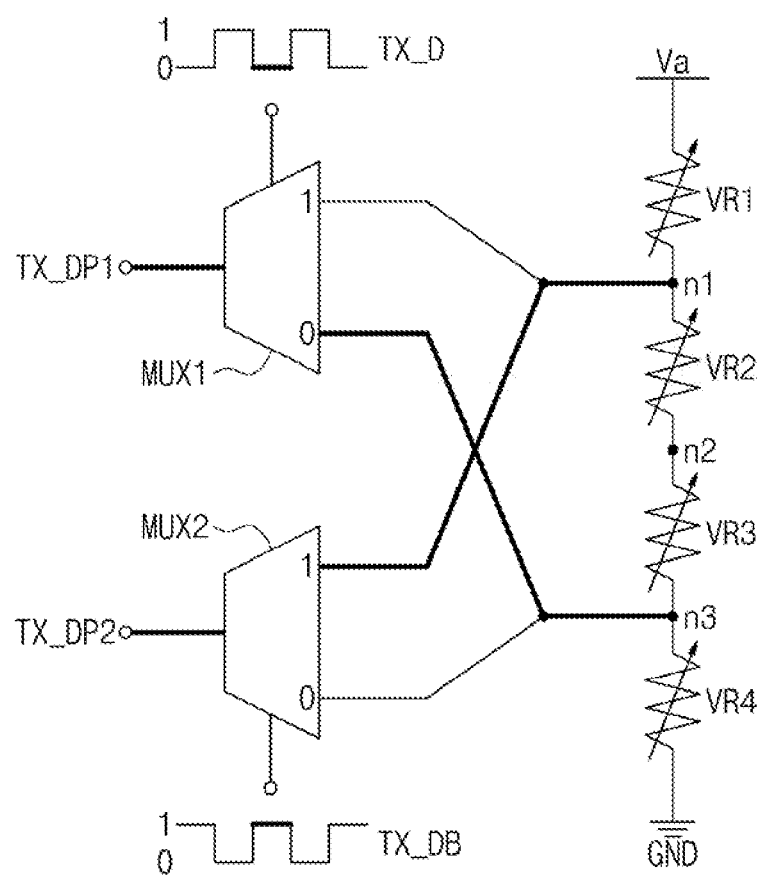

FIGS. 4A and 4B are diagrams illustrating operations of a test circuit of FIG. 3B.

Referring to FIGS. 3B, 4A, and 4B, the test circuit 125 may include a first multiplexer MUX1, a second multiplexer MUX2, and a resistor ladder including first to fourth variable resistors VR1, VR2, VR3, and VR4.

Resistance values of the first to fourth variable resistors VR1, VR2, VR3, and VR4 may be the same or different. For convenience of description, it is assumed that the resistance values of the first to fourth variable resistors VR1, VR2, VR3, and VR4 are the same. Below, in FIGS. 4A and 4B, a connection relationship and an operation method of the first multiplexer MUX1, the second multiplexer MUX2, and the first to fourth variable resistors VR1, VR2, VR3, and VR4 will be described as an example for convenience of description, but a test circuit of the present disclosure is not limited thereto.

The first to fourth variable resistors VR1, VR2, VR3, and VR4 may be serially connected. A power supply voltage Va may be input to the first variable resistor VR1, and may be evenly distributed among the first to fourth variable resistors VR1, VR2, VR3, and VR4. For example, when the power supply voltage Va is 400 mV, the power supply voltage Va may be distributed among the first to fourth variable resistors VR1, VR2, VR3, and VR4 by as much as 100 mV.

The resistor ladder may include a first node n1 between the first variable resistor VR1 and the second variable resistor VR2, a second node n2 between the second variable resistor VR2 and the third variable resistor VR3, and a third node n3 between the third variable resistor VR3 and the fourth variable resistor VR4.

The first multiplexer MUX1 and the second multiplexer MUX2 may be connected to different nodes of the resistor ladder. For example, each of the first multiplexer MUX1 and the second multiplexer MUX2 may be connected to the first node n1 and the third node n3. Each of the first multiplexer MUX1 and the second multiplexer MUX2 may receive voltages of different levels from the first node n1 and the third node n3.

The first multiplexer MUX1 may receive the transmission data TX_D. The first multiplexer MUX1 may output one of the voltages of the different levels based on the transmission data TX_D. The second multiplexer MUX2 may receive the inversion data TX_DB, which is an inverted version of transmission data TX_D. The second multiplexer MUX2 may output one of the voltages of the different levels based on the inversion data TX_DB.

For example, a potential of the first node n1 may be 300 mV, and a potential of the third node n3 may be 100 mV. When the transmission data TX_D is 1, the first multiplexer MUX1 may output 300 mV from the first node n1. In this case, the inversion data TX_DB may be 0, and the second multiplexer MUX2 may output 100 mV from the third node n3. On the other hand, when the transmission data TX_D is 0, the first multiplexer MUX1 may output 100 mV from the third node n3. In this case, the inversion data TX_DB may be 1, and the second multiplexer MUX2 may output 300 mV from the first node n1.

As the transmission data TX_D is repeatedly set to 1 and 0 with a specific period, the first multiplexer MUX1 may alternately select the first node n1 and the third node n3 with the specific period to alternately output 300 mV and 100 mV, while the second multiplexer MUX2 may alternately select the third node n3 and the first node n1 with the specific period to alternately output 100 mV and 300 mV.

Thus, the first post data TX_DP1 being an output of the first multiplexer MUX1 and the second post data TX_DP2 being an output of the second multiplexer MUX2 may form differential signals outputting complementary data. As a result, phases of the first post data TX_DP1 and the second post data TX_DP2 may be the same as phases of the transmission data TX_D and the inversion data TX_DB, and voltage levels of the first post data TX_DP1 and the second post data TX_DP2 may be the same as or different from voltage levels of the transmission data TX_D and the inversion data TX_DB. Voltage levels may be changed by varying resistance values of the first to fourth variable resistors VR1, VR2, VR3, and VR4.

The operation of the test circuit 125 according to FIGS. 4A and 4B may be applied to operations of test circuits to be described below.

Figure 5:
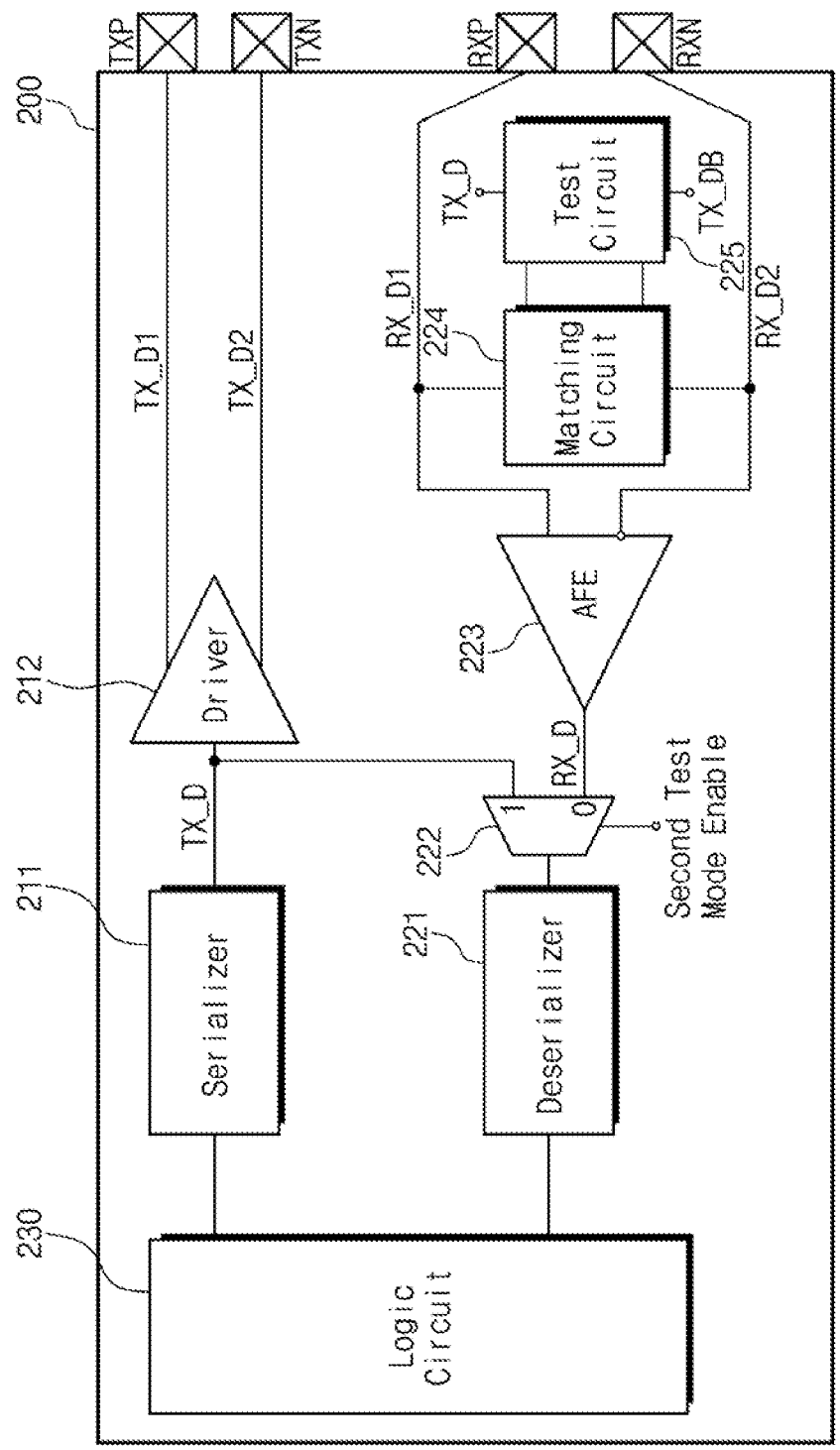
FIG. 5 is another example embodiment of an interface circuit according to an example embodiment.

FIG. 5 is another example embodiment of an interface circuit according to an example embodiment.

Referring to FIGS. 3B and 5, an interface circuit 200 may include a serializer 211, a driver 212, a deserializer 221, a multiplexer 222, an analog front end 223, a matching circuit 224, a test circuit 225, and a logic circuit 230. The serializer 211, the driver 212, the deserializer 221, the multiplexer 222, the analog front end 223, the test circuit 225, and the logic circuit 230 are similar to the serializer 111, the driver 112, the deserializer 121, the multiplexer 122, the analog front end 123, the test circuit 125, and the logic circuit 130 of FIG. 3B, and thus, additional description will be omitted to avoid redundancy.

Relative to the interface circuit 100 described in connection with FIG. 3B, the interface circuit 200 described here in connection with FIG. 5 may further include the matching circuit 224 to address impedance mismatching.

The matching circuit 224 may be connected to the analog front end 223 to calibrate an impedance difference of a receiving stage. The matching circuit 224 may include at least one or more passive elements such as a resistor, an inductor, and a capacitor. The passive elements may be connected in series and/or in parallel.

The test circuit 225 may be connected to the matching circuit 224. For example, the test circuit 225 may be connected to a termination resistor of the matching circuit 224. When the test circuit 225 is connected to the termination resistor, the influence of the test circuit 125 in the normal mode where the test circuit 225 is deactivated may be minimized. Thus, a load change of a receiver, e.g., due to addition of the test circuit 225 or an active/inactive state thereof, may be minimized.

Figure 6A:
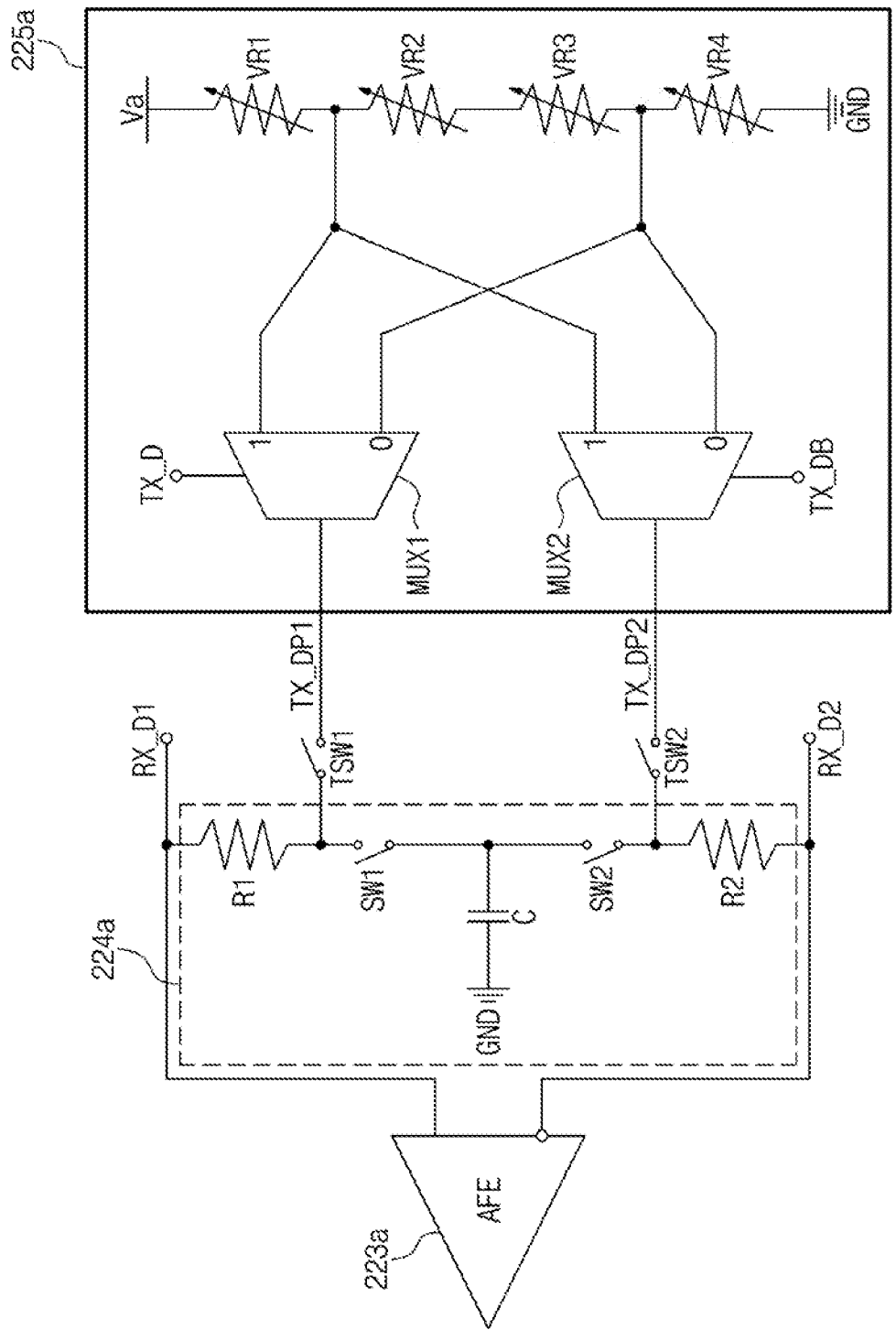
FIGS. 6A and 6B are diagrams illustrating a connection of a matching circuit and a test circuit of FIG. 5 in detail.
Figure 6B:
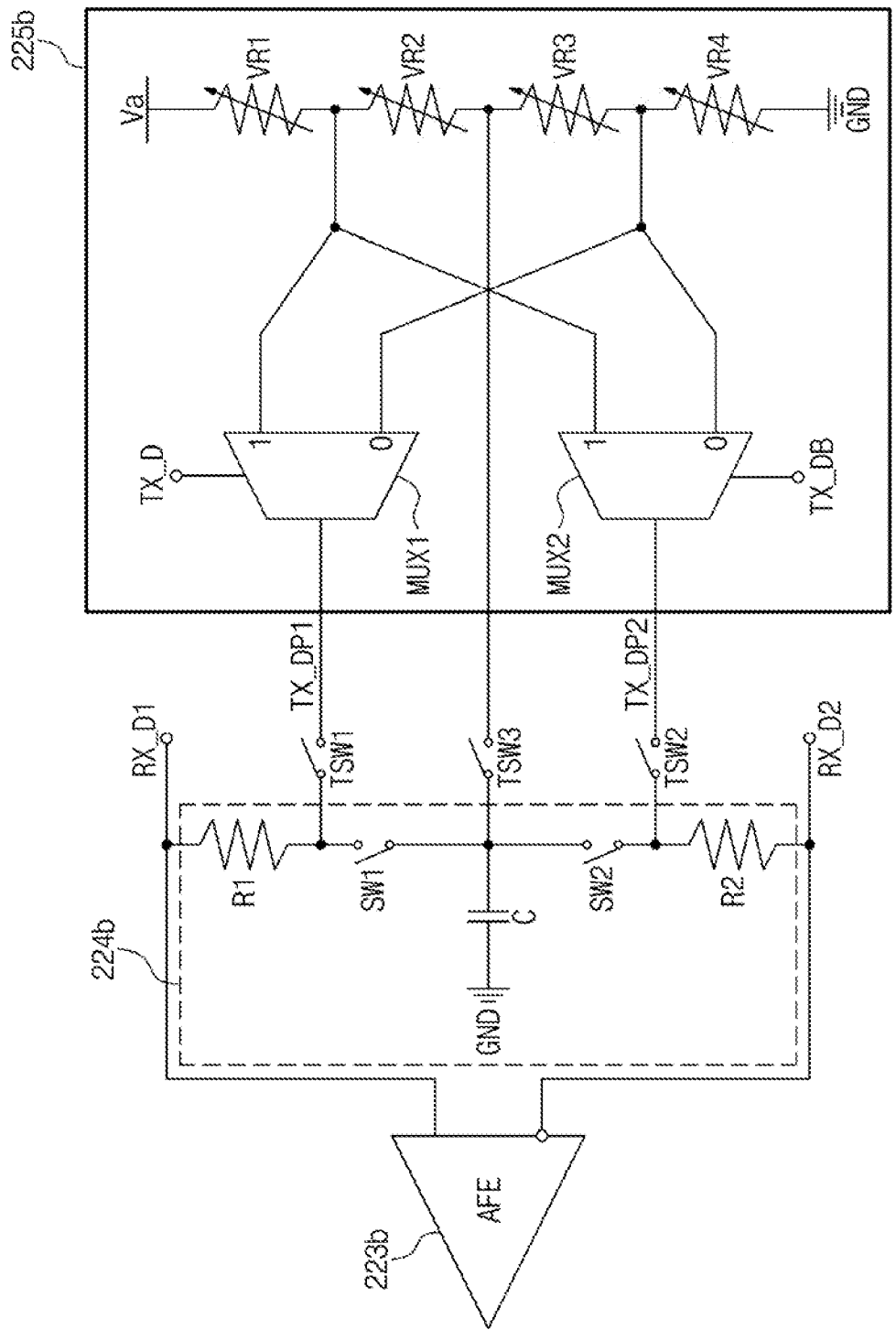

FIGS. 6A and 6B are diagrams illustrating a connection of a matching circuit and a test circuit of FIG. 5 in detail.

Referring to FIGS. 5 and 6A, a matching circuit 224a may include a first resistor R1, a second resistor R2, a first switch SW1, a second switch SW2, and a capacitor "C".

The first resistor R1 may be connected to an input terminal of the analog front end 223a, e.g., a first end of the first resistor R1 may be connected to the analog front end 223a, and a second end of the first resistor R1 may be connected to the first switch SW1. A first end of the capacitor "C" may be connected to the first switch SW1, and a second end of the capacitor "C" may be grounded.

The first resistor R1 may be a termination resistor for addressing impedance mismatching, and the first switch SW1 may be turned on to receive the first reception data RX_D1 without distortion in the normal mode. In the first test mode, the first switch SW1 may be turned off.

A first end of the second resistor R2 may be connected to an inverting input terminal of the analog front end 223a to receive the second reception data RX_D2, and a second end of the second resistor R2 may be connected to the second switch SW2. The first end of the capacitor "C" may be connected to the second switch SW2, and the second end of the capacitor "C" may be grounded. Thus, the first switch SW1 and the second switch SW2 may be connected in parallel when viewed from the capacitor "C".

The second resistor R2 may be a termination resistor for addressing impedance mismatching, and the second switch SW2 may be turned on to receive the second reception data RX_D2 without distortion in the normal mode. In the first test mode, the second switch SW2 may be turned off.

The test circuit 225a may be connected to the matching circuit 224a. For example, the test circuit 225a may be connected to the second end of the first resistor R1 and the second end of the second resistor R2. Accordingly, in normal operation, the first reception data RX_D1 and the second reception data RX_D2 may be minimally influenced by the test circuit 225a.

The test circuit 225a may include the plurality of multiplexers MUX1 and MUX2 and the resistor ladder including the plurality of variable resistors VR1, VR2, VR3, and VR4. For example, the resistor ladder may include the first to fourth variable resistors VR1, VR2, VR3, and VR4, and the first to fourth variable resistors VR1, VR2, VR3, and VR4 may be connected in series between a power supply terminal and a ground. The power supply voltage Va may be supplied to the resistor ladder through the power supply terminal, and the power supply voltage Va may be divided depending on a resistance ratio of the first to fourth variable resistors VR1, VR2, VR3, and VR4. The detailed configuration and operation of the test circuit 225a are similar to those of FIGS. 4A and 4B, and thus, additional description will be omitted to avoid redundancy.

The first multiplexer MUX1 may receive voltages of different levels from the different nodes of the resistor ladder, and may receive the transmission data TX_D from the transmitter 210. The first multiplexer MUX1 may output one of the voltages of the different levels in response to the transmission data TX_D. The second multiplexer MUX2 may receive voltages of different levels from the different nodes of the resistor ladder, and may receive the inversion data TX_DB, which is an inverted version of the transmission data TX_D, from the transmitter 210. The second multiplexer MUX2 may output one of the voltages of the different levels in response to the inversion data TX_DB.

A first test switch TSW1 may be connected to a connection node between the first resistor R1 and the first switch SW1, and may be connected to an output terminal of the first multiplexer MUX1. The first test switch TSW1 may operate in response to a signal to enter the first test mode. For example, the first test switch TSW1 may be turned on in response to the signal to enter the first test mode. In the first test mode, instead of the first reception data RX_D1, the first post data TX_DP1 may be input to the input terminal (non-inverting input terminal) of the analog front end 223a.

A second test switch TSW2 may be connected to a connection node between the second resistor R2 and the second switch SW2, and may be connected to an output terminal of the second multiplexer MUX2. The second test switch TSW2 may operate in response to the signal to enter the first test mode. For example, the first test switch TSW1 may be turned on in response to the signal to enter the first test mode. In the first test mode, instead of the second reception data RX_D2, the second post data TX_DP2 may be input to the inverting input terminal of the analog front end 223a.

Referring to FIGS. 5 and 6B, a matching circuit 224b may include the first resistor R1, the second resistor R2, the first switch SW1, the second switch SW2, and the capacitor "C", and a test circuit 225b may include the plurality of multiplexers MUX1 and MUX2 and the resistor ladder including the plurality of variable resistors VR1, VR2, VR3, and VR4. Configurations of the matching circuit 224b and the test circuit 225b are similar to those of the matching circuit 224a and the test circuit 225a of FIG. 6A, and thus, additional description will be omitted to avoid redundancy.

In the present example embodiment, the test circuit 225b may also be connected to the matching circuit 224b through a third test switch TSW3. For example, the third test switch TSW3 may be connected between a node between the first switch SW1 and the second switch SW2, and may be connected to another node of the resistor ladder, e.g., to a second node between the second variable resistor VR2 and the third variable resistor VR3. The capacitor "C" may be further connected to the second node through the third test switch TSW3.

The third test switch TSW3 may operate in response to the signal to enter the first test mode. For example, the third test switch TSW3 may be turned on in response to the signal to enter the first test mode. When the third test switch TSW3 is turned on, the capacitor "C" may uniformly maintain a second level voltage of the second node of the resistor ladder. Accordingly, when the first multiplexer MUX1 or the second multiplexer MUX2 alternately outputs a first level voltage of a first node and a third level voltage of a third node, fluctuations of the first level voltage and the third level voltage may decrease.

Figure 7:
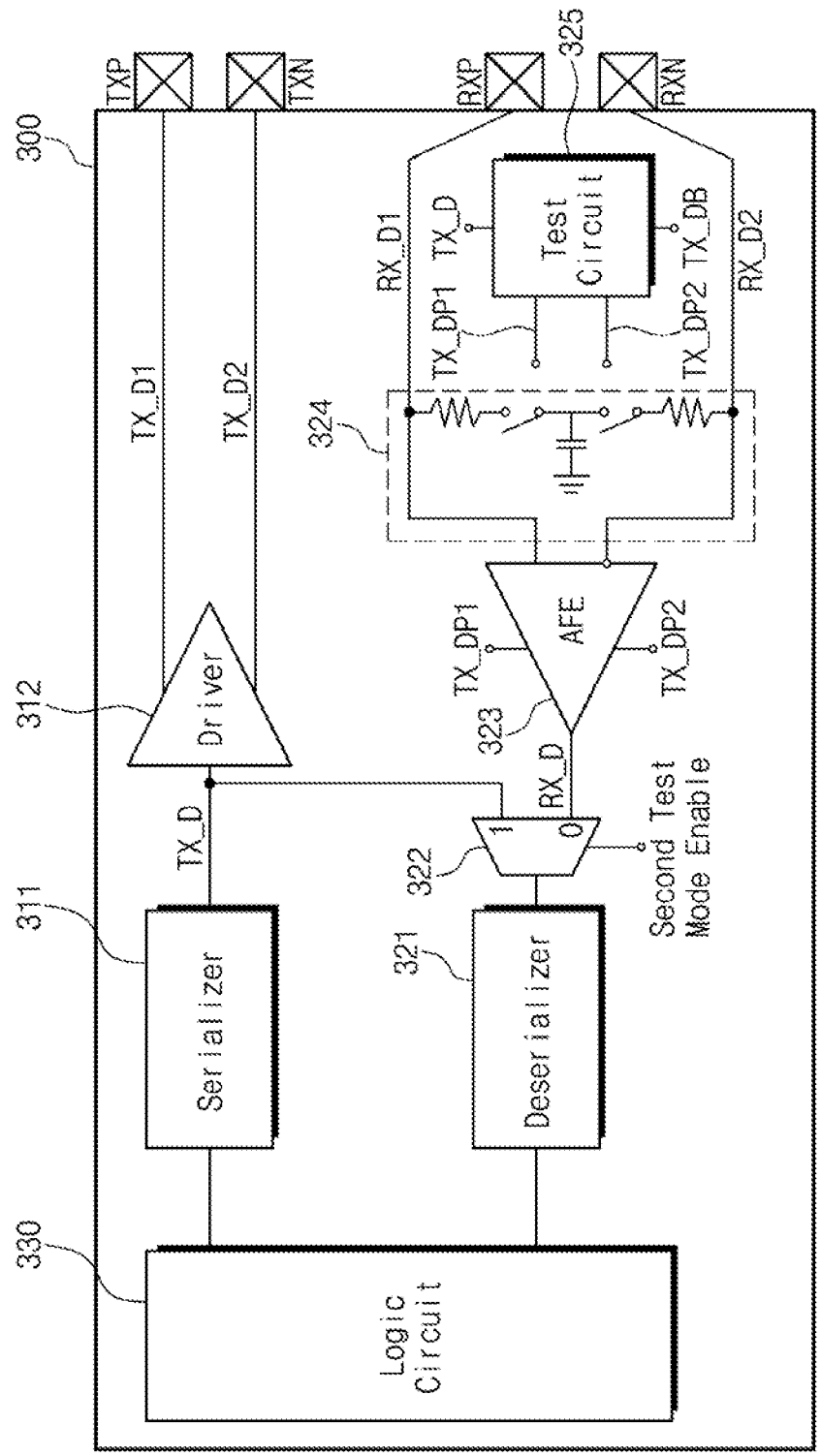
FIG. 7 is another example embodiment of an interface circuit according to an example embodiment.

FIG. 7 is another example embodiment of an interface circuit according to an example embodiment.

Referring to FIGS. 5 and 7, an interface circuit 300 may include a serializer 311, a driver 312, a deserializer 321, a multiplexer 322, an analog front end 323, a matching circuit 324, a test circuit 325, and a logic circuit 330. The serializer 311, the driver 312, the deserializer 321, the multiplexer 322, the analog front end 323, the matching circuit 324, the test circuit 325, and the logic circuit 330 are similar to the serializer 211, the driver 212, the deserializer 221, the multiplexer 222, the analog front end 223, the matching circuit 224, the test circuit 225, and the logic circuit 230 of FIG. 5, and thus, additional description will be omitted to avoid redundancy.

As compared to the interface circuit 200 described in connection with FIG. 5, referring to FIG. 7, the test circuit 325 may be directly connected to the analog front end 323. The test circuit 325 may output the first post data TX_DP1 and the second post data TX_DP2 based on the transmission data TX_D and the inversion data TX_DB. The first post data TX_DP1 and the second post data TX_DP2 may be input to the analog front end 323 without passing through the matching circuit 324. The analog front end 323 may generate the reception data RX_D based on the first post data TX_DP1 and the second post data TX_DP2. In this case, the matching circuit 324 may be in a disable state.

A connection relationship between the test circuit 325 and the analog front end 323 will be described in more detail with reference to FIGS. 8 and 9.

According to an example embodiment, the test circuit 325 may receive the first transmission data TX_D1 and the second transmission data TX_D2 rather than the transmission data TX_D and the inversion data TX_DB. For example, the driver 312 may transmit the first transmission data TX_D1 and the second transmission data TX_D2 to the test circuit 325. In this case, the test circuit 325 may output the first post data TX_DP1 and the second post data TX_DP2 based on the first transmission data TX_D1 and the second transmission data TX_D2 rather than the transmission data TX_D and the inversion data TX_DB.

The analog front end 323 may generate the reception data RX_D based on the first post data TX_DP1 and the second post data TX_DP2.

The first transmission data TX_D1 and the second transmission data TX_D2 may be different from the transmission data TX_D and the inversion data TX_DB, in that the first transmission data TX_D1 and the second transmission data TX_D2 are generated through the driver 312.

Therefore, when the test circuit 325 outputs the first post data TX_DP1 and the second post data TX_DP2 based on the first transmission data TX_D1 and the second transmission data TX_D2, the interface circuit 300 may make a test coverage high by performing the internal loopback test including the driver 112.

Figure 8:
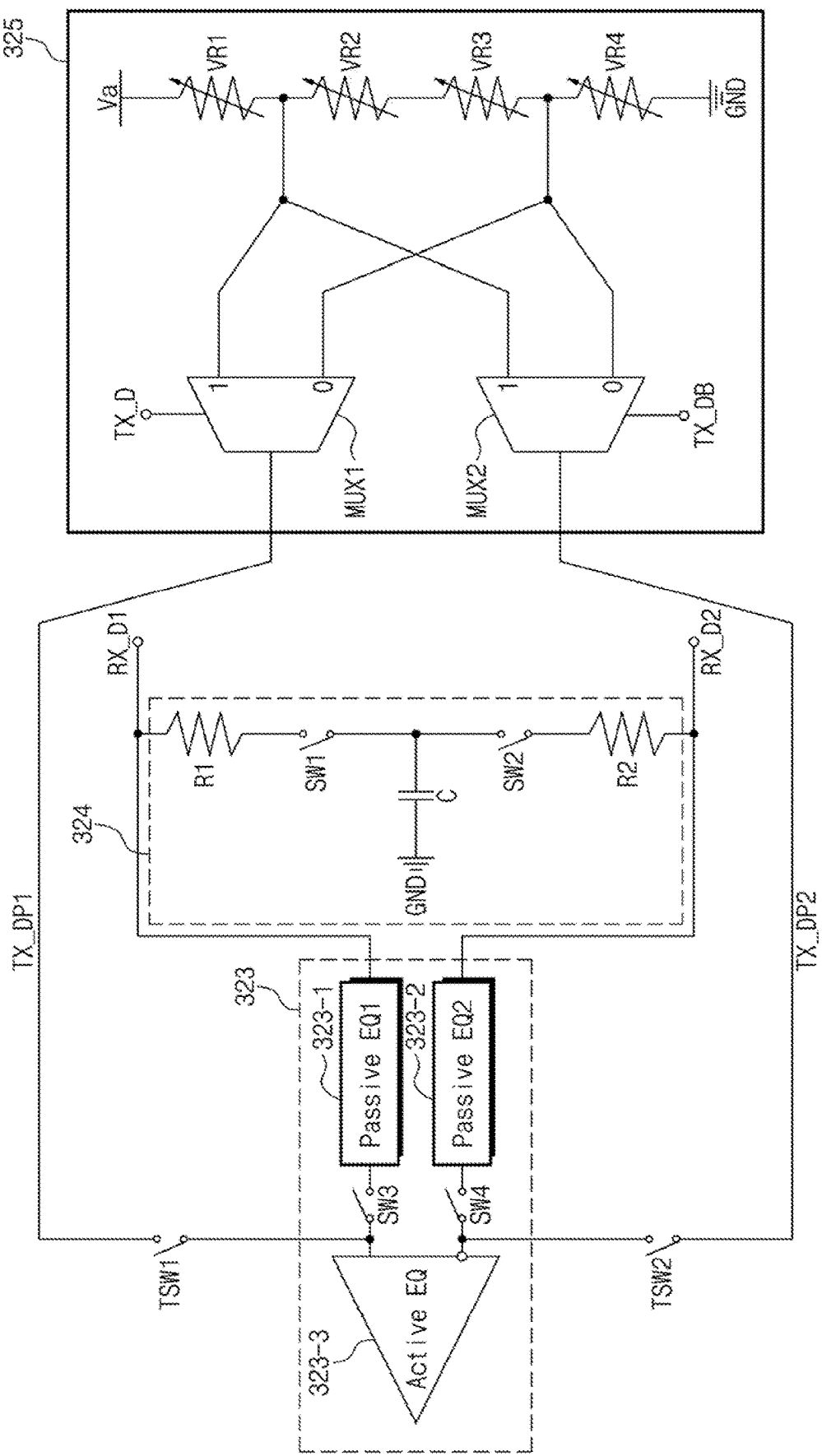
FIG. 8 is a block diagram illustrating a connection relationship of a test circuit of FIG. 7.

FIG. 8 is a block diagram illustrating a connection relationship of a test circuit of FIG. 7.

Referring to FIGS. 4A, 6A, 7, and 8, the test circuit 325 may be connected to the analog front end 323 without passing through the matching circuit 324.

The matching circuit 324 may include the first resistor R1, the second resistor R2, the first switch SW1, the second switch SW2, and the capacitor "C". The test circuit 325 may include the plurality of multiplexers MUX1 and MUX2 and the resistor ladder including the plurality of variable resistors VR1, VR2, VR3, and VR4. Configurations of the matching circuit 324 and the test circuit 325 are similar to those of the matching circuit 224a of FIG. 6A and the test circuit 125 of FIG. 4A, and thus, additional description will be omitted to avoid redundancy.

The analog front end 323 may include a first passive equalizer 323-1, a second passive equalizer 323-2, an active equalizer 323-3, a third switch SW3, and a fourth switch SW4.

Each of the first passive equalizer 323-1 and the second passive equalizer 323-2 may be a component for reconstructing a signal distorted on a channel or a high-speed serial link, and may be composed of passive elements such as a resistor and an inductor. Thus, the first passive equalizer 323-1 and the second passive equalizer 323-2 may compensate for frequency attenuation of signals received through input terminals (i.e., inverting and non-inverting input terminals) of the analog front end 323, respectively.

As in the passive equalizer, the active equalizer 323-3 may compensate for distortion of a signal due to a channel. The active equalizer 323-3 may include an active element such as an amplifier. The active equalizer 323-3 may amplify received differential signals with a variable gain and may compensate for high-frequency attenuation.

The first passive equalizer 323-1 may be connected to an input terminal (or non-inverting input terminal) of the active equalizer 323-3 through the third switch SW3. In the first test mode, the third switch SW3 may be turned off. The second passive equalizer 323-2 may be connected to an input terminal (or inverting input terminal) of the active equalizer 323-3 through the fourth switch SW4. In the first test mode, the fourth switch SW4 may be turned off.

The test circuit 325 may be connected to the active equalizer 323-3. For example, the first multiplexer MUX1 may be connected to the non-inverting input terminal of the active equalizer 323-3. The first multiplexer MUX1 may output the first post data TX_DP1 to the active equalizer 323-3. The first multiplexer MUX1 may be connected to the active equalizer 323-3 through the first test switch TSW1. The first test switch TSW1 may be turned on in response to the signal to enter the first test mode, and the first post data TX_DP1 may be input to the active equalizer 323-3.

The second multiplexer MUX2 may be connected to the inverting input terminal of the active equalizer 323-3. The second multiplexer MUX2 may output the second post data TX_DP2 to the active equalizer 323-3. The second multiplexer MUX2 may be connected to the active equalizer 323-3 through the second test switch TSW2. The second test switch TSW2 may be turned on in response to the signal to enter the first test mode, and the second post data TX_DP2 may be input to the active equalizer 323-3.

The active equalizer 323-3 may perform variable gain amplification and frequency attenuation compensation based on the first post data TX_DP1 and the second post data TX_DP2 of a serial data format, to output the reception data RX_D.

Figure 9:
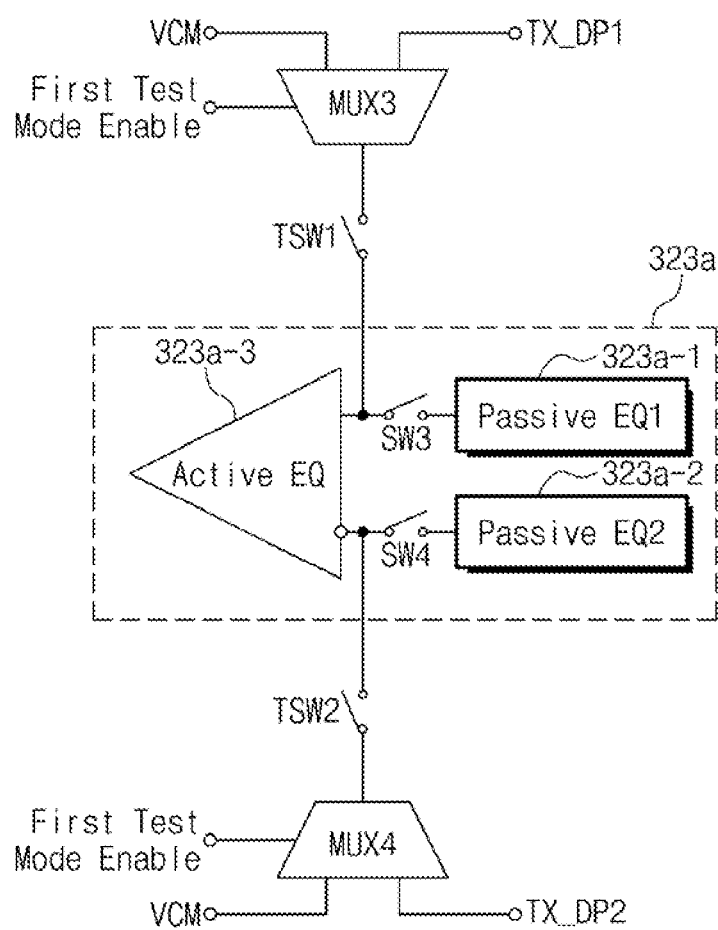
FIG. 9 is a block diagram illustrating another example embodiment of a connection relationship of a test circuit of FIG. 7.

FIG. 9 is a block diagram illustrating another example embodiment of a connection relationship of a test circuit of FIG. 7.

As for the example embodiments of FIGS. 7 and 8, in the example embodiment of FIG. 9, the test circuit 325 may be connected to an analog front end 323a without passing through the matching circuit 324.

The analog front end 323a may include a first passive equalizer 323a-1, a second passive equalizer 323a-2, an active equalizer 323a-3, the third switch SW3, and the fourth switch SW4. The first passive equalizer 323a-1, the second passive equalizer 323a-2, the active equalizer 323a-3, the third switch SW3, and the fourth switch SW4 are similar to the first passive equalizer 323-1, the second passive equalizer 323-2, the active equalizer 323-3, the third switch SW3, and the fourth switch SW4 of FIG. 8, and thus, additional description will be omitted to avoid redundancy.

The test circuit 325 may be connected to input terminals (i.e., non-inverting and inverting input terminals) of the active equalizer 323a-3 through the first test switch TSW1, the second test switch TSW2, the third multiplexer MUX3, and the fourth multiplexer MUX4.

The third multiplexer MUX3 may receive the first post data TX_DP1 and a common mode voltage VCM. The common mode voltage VCM may be used for offset calibration of a continuous time linear equalizer (CTLE) in the normal mode. The third multiplexer MUX3 may output the first post data TX_DP1 in response to a first test mode enable signal.

The active equalizer 323-3 may include the CTLE, configured to correct signal distortion due to high-frequency attenuation of a signal coming from a channel. The CTLE may perform offset calibration for the purpose of removing an offset voltage occurring due to mismatch between components (e.g., transistors) in a receiver.

The first test switch TSW1 may be turned on in response to the signal to enter the first test mode. The first post data TX_DP1 output from the test circuit 325 may be input to the input terminal (i.e., non-inverting input terminal) of the active equalizer 323a-3 through the third multiplexer MUX3 and the first test switch TSW1.

The fourth multiplexer MUX4 may receive the second post data TX_DP2 and the common mode voltage VCM. The fourth multiplexer MUX4 may output the second post data TX_DP2 in response to the first test mode enable signal. The second test switch TSW2 may be turned on in response to the signal to enter the first test mode. The second post data TX_DP2 output from the test circuit 325 may be input to the inverting input terminal of the active equalizer 323a-3 through the fourth multiplexer MUX4 and the second test switch TSW2.

According to an example embodiment, the first test switch TSW1 and the second test switch TSW2 may be turned on when the common mode voltage VCM for offset calibration in the normal mode is applied. The test circuit 325 may be connected to the first test switch TSW1 and the second test switch TSW2 used for offset calibration, which may make it possible to minimize the addition of circuit components and to reduce the influence of an additional load in the normal mode.

Figure 10:
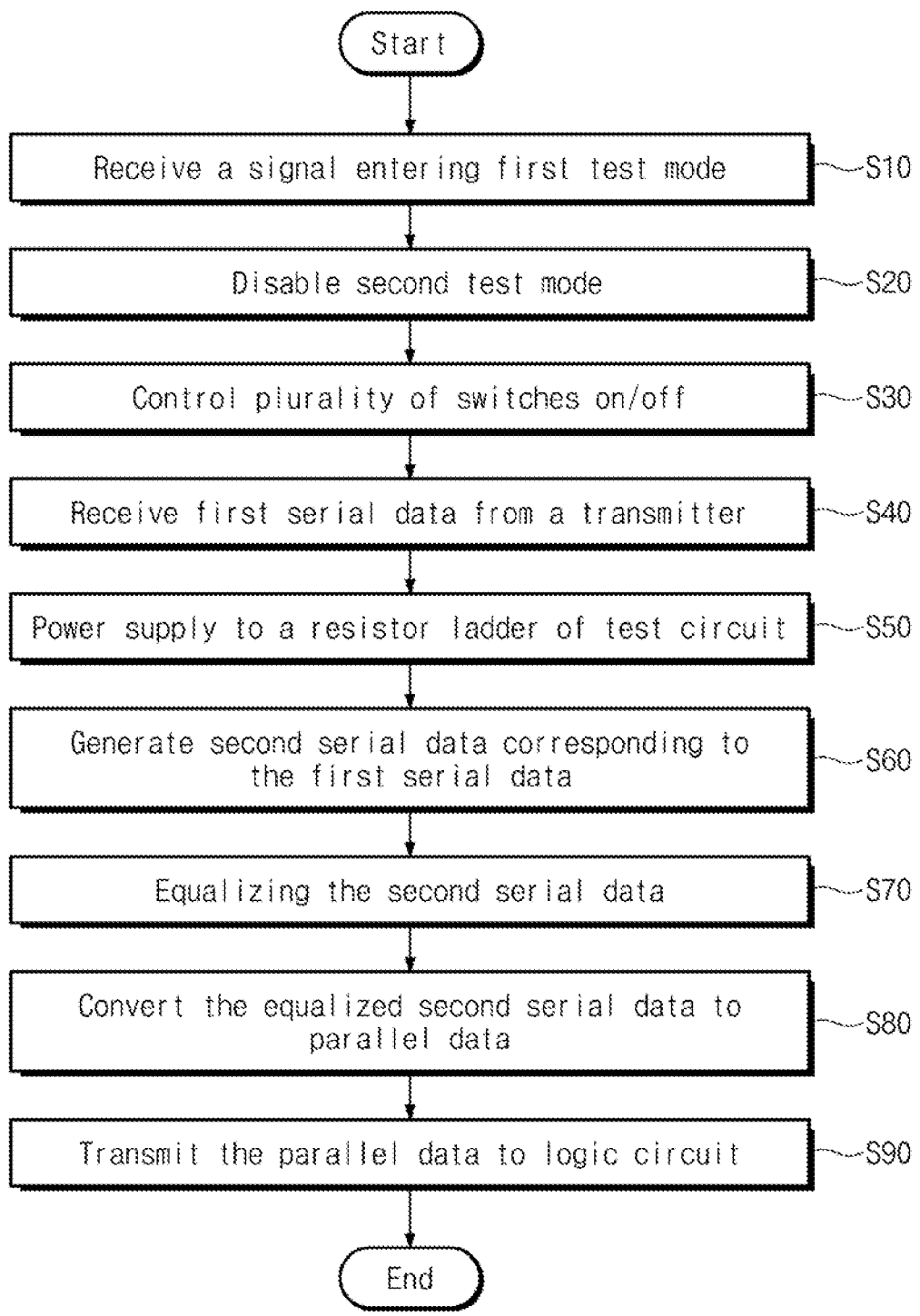
FIG. 10 is a flowchart illustrating an operation method of a receiver according to an example embodiment.

FIG. 10 is a flowchart illustrating an operation method of a receiver according to an example embodiment.

Referring to FIGS. 3B and 10, the receiver 120 may perform a full-path test forming an internal loop passing through all the components of the receiver 120 in the first test mode.

In operation S10, the receiver 120 may receive the enter signal to the first test mode. The first test mode may be a full-path test mode. For example, the receiver 120 may receive the signal to enter the first test mode from the logic circuit 130. In operation S20, the receiver 120 may disable the second test mode. The second test mode may be a part-path test mode. For example, the logic circuit 130 may generate the signal to enter the first test mode, and may simultaneously generate a second test mode disable signal.

In operation S30, the receiver 120 may control a plurality of switches in response to the signal to enter the first test mode. According to an example embodiment, the receiver 120 may turn off the first switch SW1 and the second switch SW2 of FIGS. 6A and 6B, and may turn on the first test switch TSW1, the second test switch TSW2, and the third test switch TSW3 of FIGS. 6A and 6B. According to an example embodiment, the receiver 120 may turn off the first to fourth switches SW1 to SW4 of FIG. 8, and may turn on the first test switch TSW1 and the second test switch TSW2 of FIG. 8. According to an example embodiment, the receiver 120 may turn off the third and fourth switches SW3 and SW4 of FIG. 9, and may turn on the first test switch TSW1 and the second test switch TSW2 of FIG. 9.

In operation S40, the receiver 120 may receive first serial data from the transmitter 110. For example, the test circuit 125 may receive the first serial data from the transmitter 110. The first serial data may be the transmission data TX_D including information that the transmitter 110 intends to transfer. The transmission data TX_D may include the second test data TD2 of FIG. 2B.

In operation S50, the receiver 120 may divide the power supply voltage Va depending on a resistance division ratio. For example, the test circuit 125 may include the resistor ladder including the plurality of resistors, and the power supply voltage Va input to the resistor ladder may be divided according to resistance values of the plurality of resistors. The test circuit 125 may output voltages of different levels from different nodes thereof.

In operation S60, the receiver 120 may generate second serial data corresponding to the first serial data. For example, the test circuit 125 may receive the first serial data, may generate the second serial data corresponding to a characteristic of the first serial data, and may output the second serial data to the analog front end 123. The second serial data may include the first post data TX_DP1 and the second post data TX_DP2 as differential signals.

In operation S70, the receiver 120 may equalize the second serial data. For example, the analog front end 123 may perform gain amplification and frequency attenuation compensation on the second serial data received from the test circuit 125. The analog front end 123 may provide the equalized second serial data to the deserializer 121 through the multiplexer 122.

In operation S80, the receiver 120 may convert the equalized second serial data into second parallel data. The second parallel data may correspond to the third test data TD3 of FIG. 2B. In operation S90, the receiver 120 may provide the second parallel data to the logic circuit 130. The logic circuit 130 may process the second parallel data to generate a test result signal indicating whether a defect is present in the receiver 120.

Figure 11:
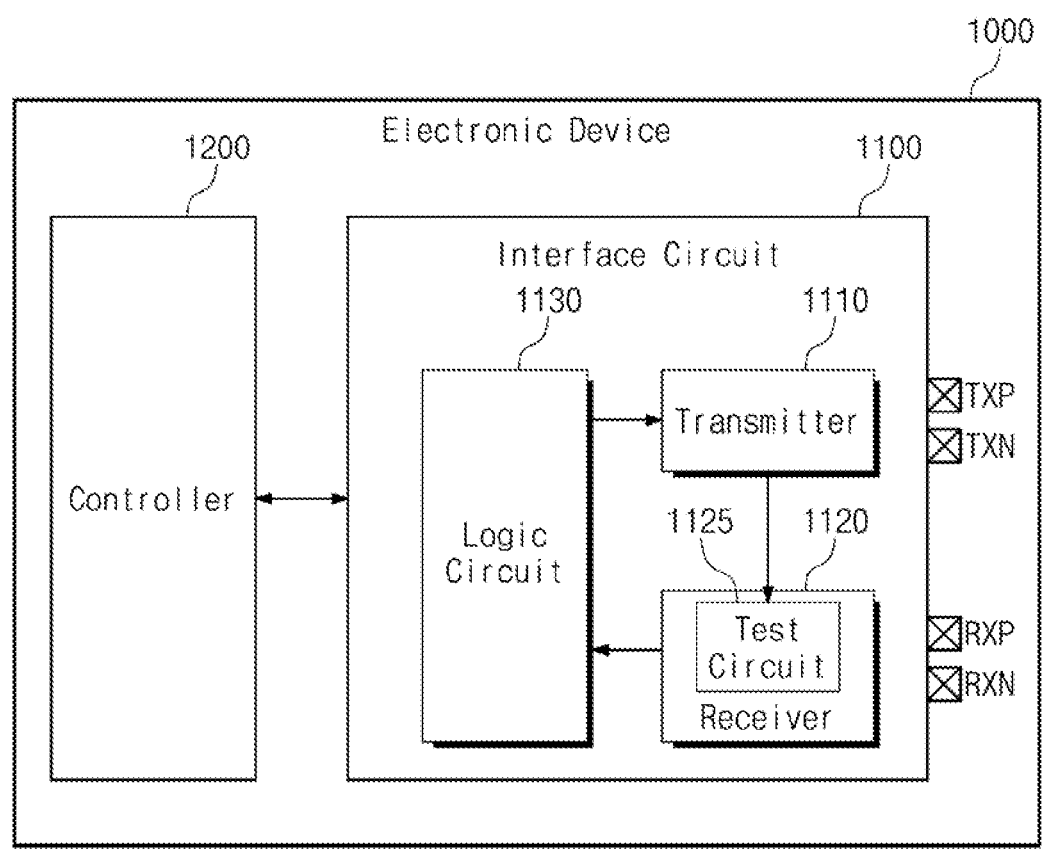
FIG. 11 is a block diagram illustrating an electronic device to which an interface circuit according to an example embodiment is applied.

FIG. 11 is a block diagram illustrating an electronic device to which an interface circuit according to an example embodiment is applied.

Referring to FIG. 11, an electronic device 1000 may include an interface circuit 1100 and a controller 1200.

The electronic device 1000 may be a data storage device such as universal flash storage (UFS) or a solid state drive (SSD) or may be a semiconductor device such as an application processor (AP) or a central processing unit (CPU).

The interface circuit 1100 may include a transmitter 1110, a receiver 1120, and a logic circuit 1130. The receiver 1120 may include a test circuit 1125 for a full-path test. The transmitter 1110, the receiver 1120, and the test circuit 1125 are similar to the transmitter 110, the receiver 120, and the test circuit 125 of FIG. 2B, and thus, additional description will be omitted to avoid redundancy.

The interface circuit 1100 may be electrically connected to the differential transmission pads TXP and TXN for outputting transmission data being differential signals. The interface circuit 1100 may be electrically connected to the differential reception pads RXP and RXN for receiving reception data as differential signals. The differential transmission pads TXP and TXN and the differential reception pads RXP and RXN may be present in the electronic device 1000. According to an example embodiment, the differential transmission pads TXP and TXN and the differential reception pads RXP and RXN may be exposed to the outside of the electronic device 1000.

The controller 1200 may exchange signals with the interface circuit 1100 for the internal loopback test of the interface circuit 1100. For example, the controller 1200 may provide the interface circuit 1100 with the signal to enter the first test mode for the full-path test. Alternatively, the controller 1200 may provide the interface circuit 1100 with the signal to enter second test mode for the part-path test. The interface circuit 1100 may provide the controller 1200 with a test result signal indicating a test result in the first mode or the second mode.

Figure 12:
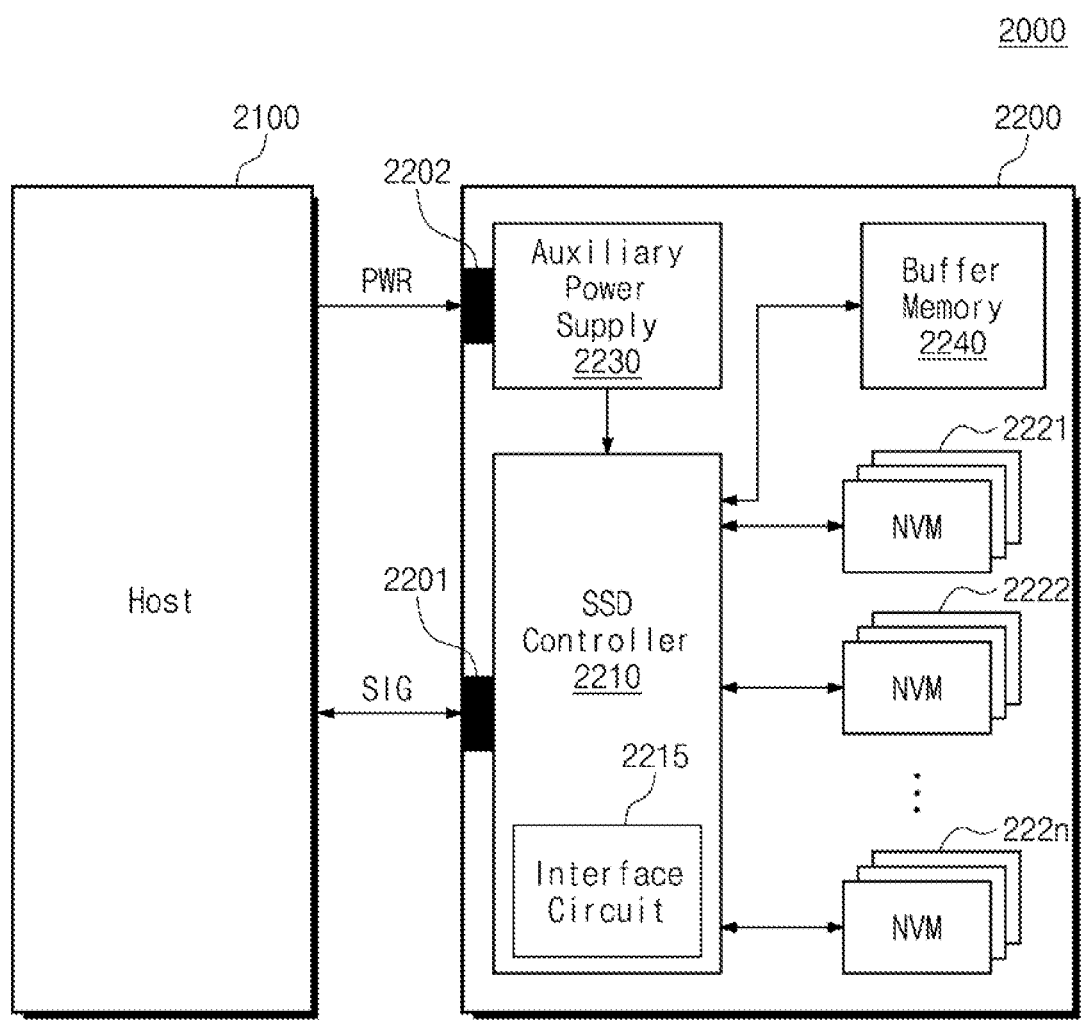
FIG. 12 is a block diagram illustrating a solid state drive (SSD) system to which an interface circuit according to an example embodiment is applied.

FIG. 12 is a block diagram illustrating a solid state drive (SSD) system to which an interface circuit according to an example embodiment is applied.

Referring to FIG. 12, an SSD system 2000 may include a host 2100 and a storage device 2200. For example, the SSD system 2000 may be a computing system, which is configured to process a variety of information, such as a personal computer (PC), a notebook, a laptop, a server, a workstation, a tablet PC, a smartphone, a digital camera, and a black box.

The host 2100 may control overall operations of the SSD system 2000. For example, the host 2100 may store data in the storage device 2200 or may read data stored in the storage device 2200. The storage device 2200 may exchange signals SIG with the host 2100 through a signal connector 2201 and may be supplied with a power PWR through a power connector 2202. The storage device 2200 may include an SSD controller 2210, a plurality of nonvolatile memories 2221 to 222n, an auxiliary power supply 2230, and a buffer memory 2240.

The SSD controller 2210 may control the plurality of nonvolatile memories 2221 to 222n in response to the signals SIG received from the host 2100. The plurality of nonvolatile memories 2221 to 222n may operate under control of the SSD controller 2210.

According to an example embodiment, the SSD controller 2210 may include an interface circuit 2215 for data transmission and reception, and the interface circuit 2215 may correspond to one of the above interface circuits. For example, the interface circuit 2215 may include a test circuit that may perform the internal loopback test in the first test mode. For example, the interface circuit 2215 may provide a communication interface such as UFS, SATA, SATAe, SCSI, SAS, PCIe, NVMe, or AHCI.

The auxiliary power supply 2230 may be connected to the host 2100 through the power connector 2202. The auxiliary power supply 2230 may receive the power PWR from the host 2100 and may be charged by the power PWR. When a power is not smoothly supplied from the host 2100, the auxiliary power supply 2230 may power the storage device 2200. The buffer memory 2240 may be used as a buffer memory of the storage device 2200.

By way of summation and review, a test of an interface circuit may include an external loopback test that is performed through a loop formed to include a transmit/receive pad provided outside a chip. Test coverage of the external loopback test is high. However, nowadays, as a communication speed between electronic devices increases, the external loopback test may fail to cover the highest communication speed of a serial communication interface. Accordingly, there is a demand on a device and a method capable of performing a loopback test without speed limitation and capable of increasing test coverage.

As described above, according to an example embodiment, a transceiver may include a test circuit to perform a full-path test including an analog front end, thus improving a test coverage of an internal loopback test. The test circuit may be connected to a specific node of a receiver such that the influence of the test circuit in a normal operation is minimized.

Embodiments may provide a transceiver performing an internal loopback test of an improved test coverage at a high-speed interface circuit for serial communication, and an operation method thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A transceiver, comprising:
a logic circuit configured to generate parallel transmission data in response to a first test mode signal or a second test mode signal;
a serializer configured to convert the parallel transmission data into serial transmission data;
a driver configured to receive the serial transmission data, and to output the serial transmission data through transmission pads;
an analog circuit configured to receive serial reception data through reception pads;
a deserializer configured to convert the serial reception data into parallel reception data; and
a test circuit that is selectively electrically connected to the analog circuit according to the first test mode signal, the test circuit being configured to receive the serial transmission data as a select signal to a first multiplexer that outputs serial post data, and to output the serial post data corresponding to the serial transmission data to the analog circuit.

2. The transceiver as claimed in claim 1, wherein the test circuit includes:
a resistor ladder including a plurality of variable resistors connected in series between a first voltage node and a second voltage node; and
a plurality of multiplexers connected to different nodes between the plurality of variable resistors, the plurality of multiplexers including the first multiplexer.

3. The transceiver as claimed in claim 2, wherein the plurality of multiplexers include:
the first multiplexer, which is configured to receive the serial transmission data and to output first post data in response to the serial transmission data; and
a second multiplexer, which is configured to receive inversion data, which is an inverted version of the serial transmission data, as a select signal, and to output second post data in response to the inversion data.

4. The transceiver as claimed in claim 3, wherein the first post data are data obtained by alternately outputting a first voltage of a first node of the different nodes and a second voltage of a second node different from the first node from among the different nodes, and
wherein the second post data are data obtained by alternately outputting the second voltage of the second node and the first voltage of the first node.

5. The transceiver as claimed in claim 4, wherein a phase of the first post data corresponds to a phase of the serial transmission data, and a phase of the second post data corresponds to a phase of the inversion data.

6. The transceiver as claimed in claim 4, further comprising an impedance matching circuit that includes:
a first termination resistor including a first end connected to a non-inverting input terminal of the analog circuit;
a first switch connected to a second end of the first termination resistor;

a second termination resistor including a third end connected to an inverting input terminal of the analog circuit;

a second switch connected between a fourth end of the second termination resistor and the first switch; and a capacitor connected to a node between the first switch and the second switch.

7. The transceiver as claimed in claim 6, wherein the first switch and the second switch are turned off in response to the first test mode signal.

8. The transceiver as claimed in claim 6, further comprising a plurality of test switches configured to be switched in response to the first test mode signal, the test circuit being electrically connected to the analog circuit through the plurality of switches, wherein:

the plurality of test switches include:

a first test switch connected between an output terminal of the first multiplexer and the second end of the first termination resistor; and a second test switch connected between an output terminal of the second multiplexer and the fourth end of the second termination resistor, and the first test switch and the second test switch are turned on in response to the first test mode signal.

9. The transceiver as claimed in claim 8, wherein the plurality of test switches further include:

a third test switch connected between a third node of the different nodes and the capacitor, wherein the third node is different from the first node and the second node, and wherein the third test switch is turned on in response to the first test mode signal.

10. The transceiver as claimed in claim 4, wherein the analog circuit includes:

an active equalizer configured to compensate for signal distortion of the serial reception data;

a first passive equalizer and a second passive equalizer each composed of one or more passive elements;

a third switch connected between a non-inverting input terminal of the active equalizer and the first passive equalizer; and a fourth switch connected between an inverting input terminal of the active equalizer and the second passive equalizer.

11. The transceiver as claimed in claim 10, wherein the third switch and the fourth switch are turned off in response to the first test mode signal.

12. The transceiver as claimed in claim 10, further comprising a plurality of test switches configured to be switched in response to the first test mode signal, the test circuit being electrically connected to the analog circuit through the plurality of switches, wherein:

the plurality of test switches include:

a fourth test switch connected between an output terminal of the first multiplexer and the non-inverting input terminal of the active equalizer; and a fifth test switch connected between an output terminal of the second multiplexer and the inverting input terminal of the active equalizer, and the fourth test switch and the fifth test switch are turned on in response to the first test mode signal.

13. The transceiver as claimed in claim 1, further comprising a third multiplexer connected between the analog circuit and the deserializer, wherein the third multiplexer is configured to:

receive the serial post data from the analog circuit;

receive the serial transmission data from the serializer;

output the serial post data to the deserializer in response to the first test mode signal; and output the serial transmission data to the deserializer in response to the second test mode signal.

14. The transceiver as claimed in claim 13, wherein the deserializer is configured to convert the serial post data into parallel post data, and wherein the logic circuit is configured to compare the parallel post data and the parallel transmission data, and to generate test result data.

15. An interface circuit implemented on one chip, the interface circuit comprising:

transmission pads configured to output serial transmission data to an outside of the one chip;

reception pads configured to receive serial reception data from the outside of the one chip; and a transceiver configured to:

generate the serial transmission data or to process the serial reception data in a normal mode, and form a loop in an interior of the transceiver, and to generate test result data based on the serial transmission data in a test mode, wherein the transceiver includes:

a logic circuit configured to generate parallel transmission data;

a serializer configured to convert the parallel transmission data into the serial transmission data;

a driver configured to output the serial transmission data through the transmission pads;

an analog circuit configured to receive the serial reception data through the reception pads;

a deserializer configured to convert the serial reception data into parallel reception data; and a test circuit electrically connected to the analog circuit in the test mode, and configured to output serial post data corresponding to the serial transmission data to the analog circuit, the test circuit including:

a resistor ladder including a plurality of variable resistors connected in series between a first voltage node and a second voltage node; and a plurality of multiplexers connected to different nodes between the plurality of variable resistors.

16. The interface circuit as claimed in claim 15, wherein, in the test mode, the analog circuit is configured to output the serial post data to the deserializer, the deserializer is configured to convert the serial post data into parallel post data, and the logic circuit is configured to compare the parallel post data and the parallel transmission data, and to generate the test result data.

17. An operation method of a transceiver that includes an analog circuit and a test circuit, the method comprising:

generating parallel transmission data in response to a test mode signal;

converting the parallel transmission data into serial transmission data;

generating serial post data corresponding to the serial transmission data;

converting the serial post data into parallel post data; and comparing the parallel post data and the parallel transmission data to generate test result data, wherein the test circuit includes:

a resistor ladder including a plurality of variable resistors connected in series between a first voltage node and a second voltage node; and a first multiplexer and a second multiplexer connected to different nodes between the plurality of variable resistors.

18. The method as claimed in claim 17, further comprising controlling a plurality of test switches in response to the test mode signal, wherein the controlling of the plurality of test switches includes:

turning on a first test switch located between an output terminal of the first multiplexer and a non-inverting input terminal of the analog circuit, in response to the test mode signal;

turning on a second test switch located between an output terminal of the second multiplexer and an inverting input terminal of the analog circuit, in response to the test mode signal; and forming a loop in an interior of the transceiver.

19. The method as claimed in claim 17, wherein the generating of the serial post data includes:

receiving, at the first multiplexer, the serial transmission data;

alternately outputting, at the first multiplexer, a first voltage of a first node of the different nodes and a second voltage of a second node different from the first node from among the different nodes, depending on phases of the serial transmission data;

receiving, at the second multiplexer, inversion data being an inverted version of the serial transmission data; and alternately outputting, at the second multiplexer, the second voltage of the second node and the first voltage of the first node, depending on phases of the inversion data.

* * * * *